United States Patent [19]

Hung et al.

[11] Patent Number: 4,716,564
[45] Date of Patent: Dec. 29, 1987

[54] METHOD FOR TEST GENERATION

[75] Inventors: Angelo C. J. Hung; Francis C. Wang, both of Beaverton, Oreg.

[73] Assignee: Tektronix, Inc., Beaverton, Oreg.

[21] Appl. No.: 798,649

[22] Filed: Nov. 15, 1985

[51] Int. Cl.⁴ ............................................. G01R 31/28
[52] U.S. Cl. ...................................... 371/27; 324/73 R
[58] Field of Search ................. 371/27, 23; 324/73 R, 324/73 AT; 364/717, 718

[56] References Cited

U.S. PATENT DOCUMENTS

| | | | |
|---|---|---|---|
| 3,780,277 | 12/1973 | Armstrong | 371/23 |
| 3,961,250 | 6/1976 | Snethen | 371/23 X |
| 4,045,736 | 8/1977 | Carpenter | 371/27 X |
| 4,204,633 | 5/1980 | Goel | 371/27 |
| 4,365,334 | 12/1982 | Smith | 371/27 |
| 4,601,032 | 7/1986 | Robinson | 371/25 X |

Primary Examiner—Jerry Smith
Assistant Examiner—Robert W. Beausoliel, Jr.
Attorney, Agent, or Firm—John P. Dellett; Robert S. Hulse

[57] ABSTRACT

A method for providing test vectors adapted to test very large scale integrated circuit devices includes the steps of measuring testability employing a test counting procedure to provide a plurality of test count matrices. Sensitivity values are then enumerated by driving individual sensitivity values forwardly and rearwardly through the circuit, starting at the input terminals, until the test counts are accumulated. The enumerations define test vectors capable of testing the actual circuit. If the circuit includes reconvergent fanout loops, then these loops are enumerated first to provide partial solutions adopted during subsequent global enumeration.

5 Claims, 33 Drawing Figures

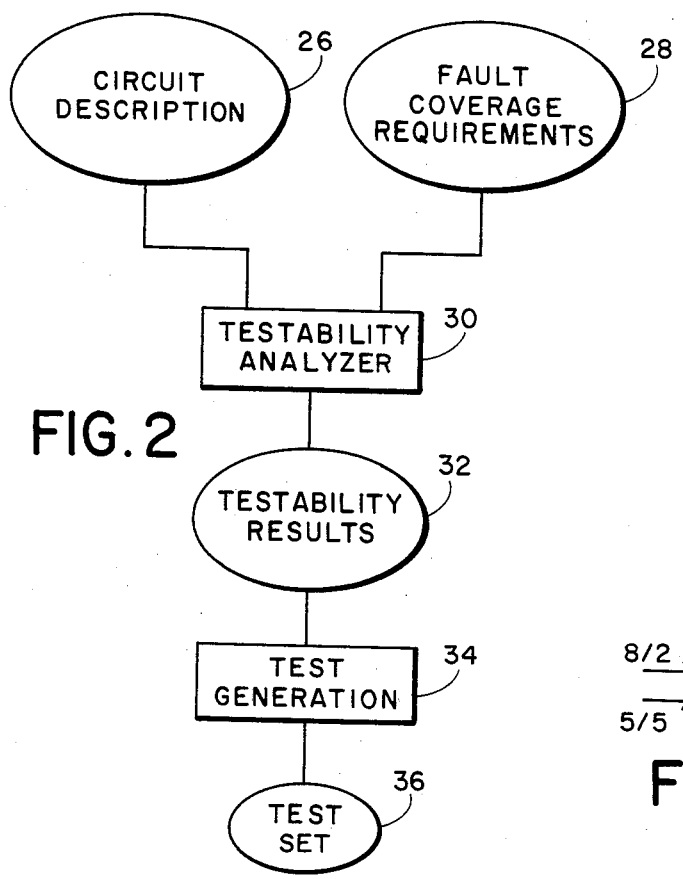
FIG. 2
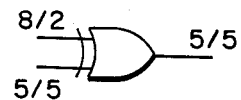
FIG. 5A
FIG. 5B
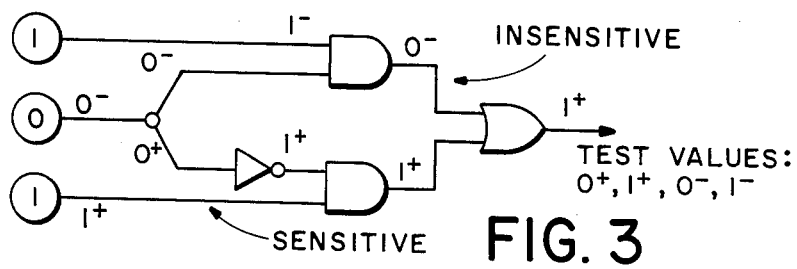
FIG. 3
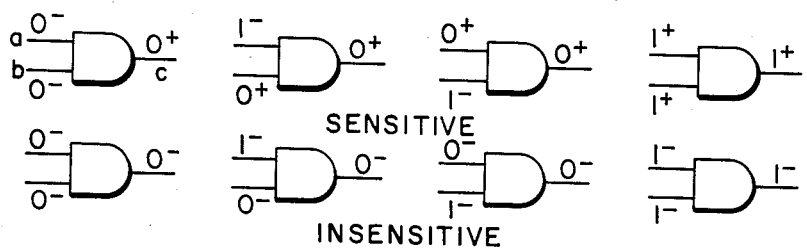
FIG. 4

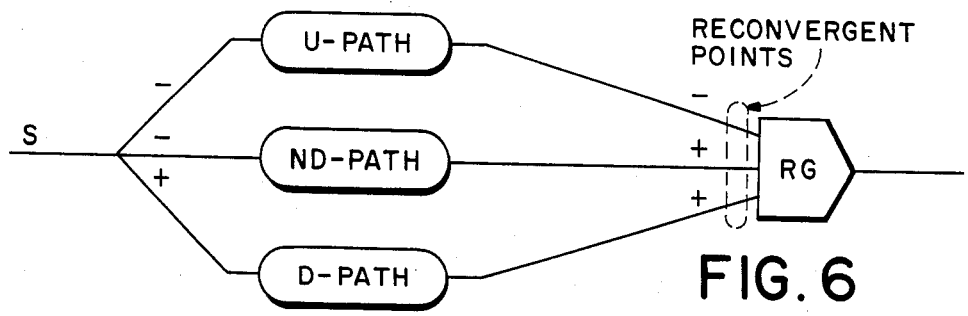
FIG. 6
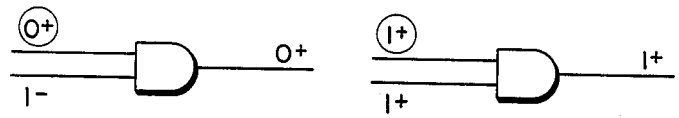
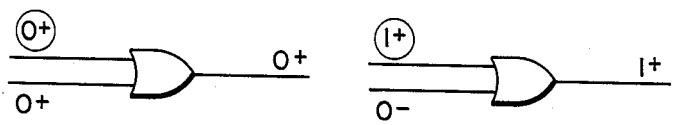
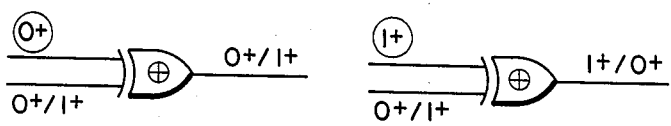
FIG. 7
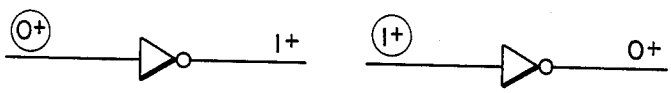
FORWARD SENSITIVITY DRIVE
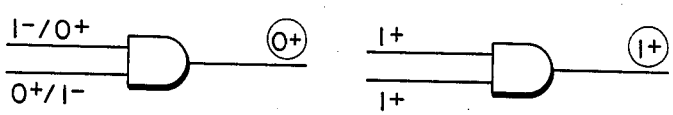
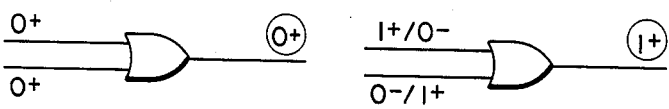
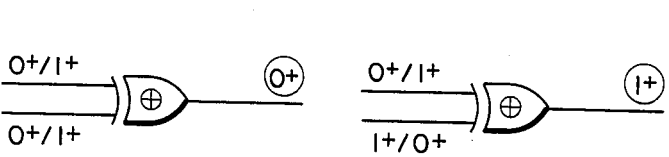
FIG. 8
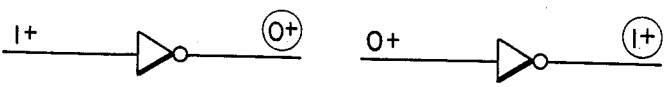
BACKWARD SENSITIVITY DRIVE

BACKWARD INSENSITIVITY DRIVE

STEP 0: THE 1st TMA RUN WITH ALL LEADS INITIALIZED TO $n_0^{\pm} = n_1^{\pm} = 1$

STEP 1: (BEGINNING OF LOCAL ENUMERATION)
ENUMERATE h1 = 0+

STEP 2: ENUMERATE h2 = 0+

STEP 3: ENUMERATE h = 0+ THROUGH MULTIPLE-PATH SENSITIZATION

STEP 4: ENUMERATE hl = 1+

STEP 5: ENUMERATE g = 0+

STEP 6: ENUMERATE e = 0+

STEP 7: DUPLICATE PARTIAL SOLUTION FROM STEP 4 TO SATISFY EXTRA REQ. ON h

STEP 8: DUPLICATE PARTIAL SOLUTION FROM STEP 5 SATISFY EXTRA REQ. ON g (END OF LOCAL ENUMERATION)

STEP 9: THE 2nd RUN OF TMA WITH REDUNDANT COUNTS SET TO 0

STEP 10: (BEGINNING OF GLOBAL ENUMERATION) DRIVE FROM c=0+ AND ADOPT PARTIAL SOLUTION FROM STEP 3 FOR RECONVERGENT FANOUT REGION

STEP 11: DRIVE FROM c=1+ AND ADOPT PARTIAL SOLUTION FROM STEP 4 FOR FANOUT REGION

STEP 12: DRIVE FROM d=1+ AND ADOPT PARTIAL SOLUTION FROM STEP 7 FANOUT REGION

STEP 13: DRIVE FROM a=1+ AND ADOPT PARTIAL SOLUTION FROM STEP 5 FOR FANOUT REGION

STEP 14: DRIVE FROM b=1+ AND ADOPT PARTIAL SOLUTION FROM STEP 8 FOR FANOUT REGION

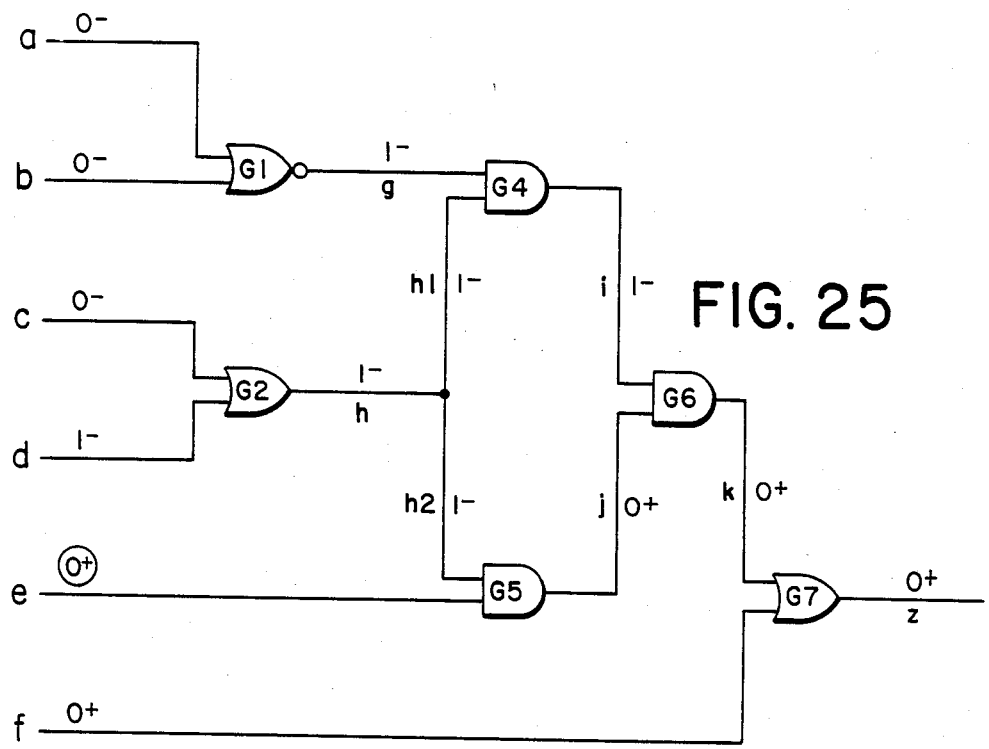
STEP 15: DRIVE FROM e=0+ AND ADOPT PARTIAL SOLUTION FROM STEP 6 FOR FANOUT REGION
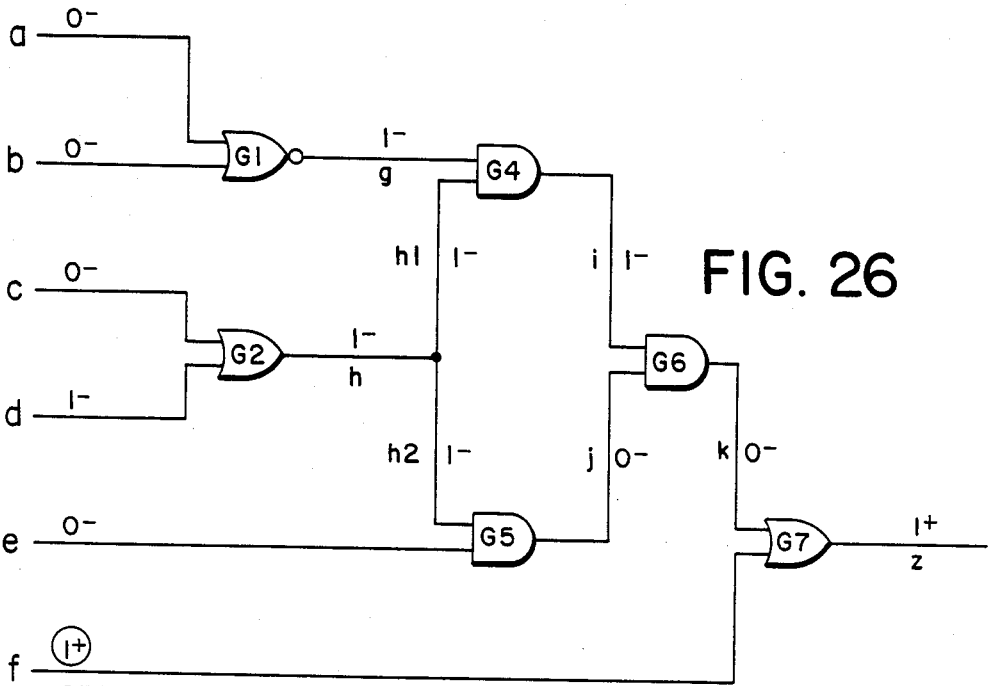
STEP 16: DRIVE FROM f=1+ AND COPY SOLUTION FROM STEP 12 BUT WITH ALL SENSITIVITY CHANGED TO INSENSITIVITY TO SATISFY k=0- (END OF GLOBAL ENUMERATION)

A COMPLETE TEST SET

| a | b | c | d | e | f | g | h | h1 | h2 | i | j | k | z |
|---|---|---|---|---|---|---|---|----|----|---|---|---|---|
| 0- | 0- | (0+) | 0+ | 1- | 0+ | 1- | 0+ | 0- | 0- | 0- | 0- | 0+ | 0+ |
| 0+ | 0+ | (1+) | 0- | 1+ | 0- | 1+ | 1+ | 1+ | 1+ | 1+ | 1+ | 1+ | 1+ |
| 0+ | 0+ | 0- | (1+) | 1+ | 0- | 1+ | 1+ | 1+ | 1+ | 1+ | 1+ | 1+ | 1+ |
| (1+) | 0- | 0- | 1- | 1- | 0+ | 0+ | 1- | 1- | 1- | 0+ | 1- | 0+ | 0+ |
| 0- | (1+) | 0- | 1- | 1- | 0+ | 0+ | 1- | 1- | 1- | 0+ | 1- | 0+ | 0+ |
| 0- | 0- | 0- | 1- | (0+) | 0+ | 1- | 1- | 1- | 1- | 1- | 0+ | 0+ | 0+ |
| 0- | 0- | 0- | 1- | 0- | (1+) | 1- | 1- | 1- | 1- | 1- | 0- | 0- | 1+ |

METHOD FOR TEST GENERATION

BACKGROUND OF THE INVENTION

The present invention relates to testing of integrated circuits and particularly to a method of producing test vectors in response to circuit design information.

As a result of the complexity of very large scale integrated circuits devices, and the inaccessibility of internal conductive paths in the finished product, efforts are frequently made at the design stage to ascertain the testability of a proposed circuit, and to design usable sets of test inputs or vectors which will check for possible faults in the manufactured device. The design vectors, i.e., those vectors which are normally intended for the circuit normal operations, may or may not be appropriate for uncovering hidden faults in the circuit, and these faults may become apparent only under unusual operating conditions. If the number of circuit input terminals is large, applying all combinations of binary input values thereto for the purpose of uncovering faults would become impractical. An alternative method utilizes an automatic test pattern generator for supplying an input vector suitable for uncovering some designated fault or faults, such as "stuck-at" faults within the circuit. Then, a fault simulator procedure is employed for checking results and ascertaining whether certain other faults will also be detected using the same input vector. That is, the fault simulator tries to grade the effectiveness of a given test. Then, another fault is proposed to the automatic test pattern generator, which fault was not covered by the first test vector, and the automatic test pattern generator provides a second test vector. This iterative process continues until a desired or acceptable number of faults are covered. Unfortunately, these procedures are very lengthy and expensive in terms of the computer time required for simulation. Consequently many designers avoid test methods of this type where possible.

In general, it does not appear there has heretofore been a really satisfactory method of generating test vectors to be employed with integrated circuit devices.

SUMMARY OF THE INVENTION

In accordance with the present invention, a procedure known as test counting is utilized to provide testability information, and then this same information is employed to generate test vectors by way of an enumeration process.

More particularly, the testability of an integrated circuit network is measured according to a test counting procedure including the propagation of sensitivity test counts forwardly from input terminals to a principal output terminal, and rearwardly back to the input terminals, through intervening gate circuitry to provide test count matrices for the nodes in the network. The test counts are enumerated from said matrices by driving individual sensitivity values at said input terminals forwardly to a said output terminal, and rearwardly back to said input terminals in a number of successive passes, whereby to accumulate the test counts as originally described by the said matrices at the various circuit nodes. A set of sensitivity values to which nodes are driven for each such pass are separately stored, and input sensitivity values for each set comprise test vectors for the integrated circuit network.

It is an object of the present invention to provide an improved method for testing integrated circuit devices.

It is a further object of the present invention to provide an improved method for testing integrated circuit devices at the design and computer simulation stage which does not require inordinate consumption of computer time.

The subject matter of the present invention is particularly pointed out and distinctly claimed in the concluding portion of this specification. However, both the organization and method of operation of the invention, together with further advantages and objects thereof, may best be understood by reference to the following description taken in connection with accompanying drawings wherein like reference characters refer to like elements.

DRAWINGS

FIG. 1 is a diagram of a prior art procedure for automatic test pattern generation, FIG. 2 is a diagram of a procedure according to the present invention for generating test vectors, FIG. 3 is a schematic diagram of a gate circuit for illustrating sensitive and insensitive test values employed in test counting, FIG. 4 illustrates sensitive and insensitive input and output values that may be present on AND gates, FIG. 5A depicts a test count matrix, FIG. 5B depicts test count values on an XOR gate, FIG. 6 illustrates definitions of paths in reconvergent fanout terminology, FIG. 7 illustrates forward sensitivity drives for a plurality of gate circuits, FIG. 8 illustrates backward sensitivity drives for a number of different gate circuits, FIG. 9 illustrates backward insensitivity drives for a plurality of gate circuits, FIGS. 10 through 26 illustrate steps 0 through 16 of a procedure according to the present invention including testability analysis and test vector generation, FIG. 27 is a chart setting forth a complete test set as derived from the procedure of FIGS. 10 through 26, and FIGS. 28 through 32 comprise a flowchart for a computerized procedure according to the present invention.

DETAILED DESCRIPTION

Figure 1:
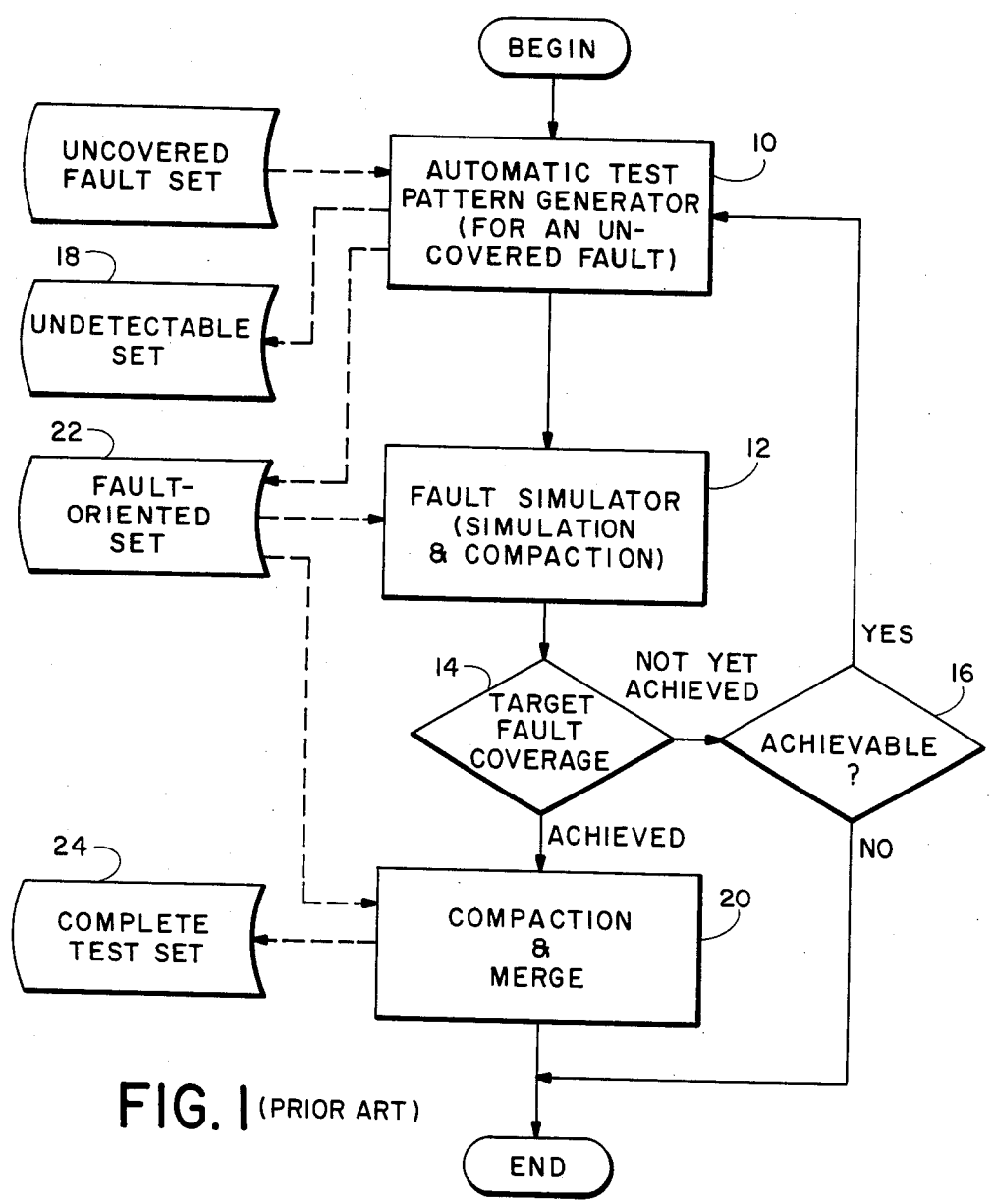

Referring to the drawings and particularly to FIG. 1, a prior art procedure is illustrated which includes automatic test pattern generation (block 10) and fault simulation (block 12). These blocks are generally implemented as successive steps on a general purpose digital computer and are repetitively applied until a predetermined or acceptable number of faults in an integrated circuit device can be uncovered by the sets of input stimuli or vectors derived by the procedure. As hereinbefore mentioned, the automatic test pattern generator starts out with an uncovered fault set which may, for example, comprise all "stuck at" faults at the various circuit nodes in an integrated circuit device. The automatic test pattern generator of the prior art is designed to propose an input vector or set of input values which will test for at least one of the "uncovered" faults. The fault simulator then grades the automatic test pattern generator as to how many faults are covered, and in decision block 14 it is determined whether a desired or acceptable fault coverage has been achieved. If it has not been achieved, return is made to the automatic test pattern generator via decision block 16 (if the fault coverage appears achievable), whereupon the test pattern generator proposes another vector for grading by the fault simulator. It is possible that some faults are undetectable from input and output terminals and therefore an undetectable fault set at 18 may be accumulated. When the desired fault coverage has been achieved, the procedure compacts and merges, at block 20, the fault oriented test set 22 and provides a complete test set 24. As hereinbefore mentioned, this prior art procedure is very time consuming and therefore expensive to carry out.

In accordance with the present invention, a simplified procedure is employed wherein the circuit description at 26 in FIG. 2, as well as the fault coverage requirements, 28, are utilized for testability analysis 30 employing a test counting procedure as hereinafter more fully described. The test counting results pertain to the number of test vectors that are suitably required to achieved desired target testability. The testability results, 32, are employed directly in a test generation step 34 which provides the completed test set 36.

The test generation program is suitably carried out on a general purpose digital computer in conjunction with the design and simulation of the underlying circuit itself. However, in the following description, the steps of this procedure will first be conceptually described, followed by a more detailed presentation of program algorithms.

For an understanding of the present procedure, it is first necessary to describe test counting or testability analysis as it has been employed heretofore for the determination of the testability of a given circuit, and the number of vectors required for achieving predetermined testability results. Test counting is described in a paper "A Test Counting Technique to Estimate Test Size", by Sheldon B. Akers and Balakrishnan Krishnamurthy, Fifth Annual IEEE Workshop on Design for Testability, April 1982, Vail, Colo. According to the test counting algorithm, "sensitivity" values for each lead are propagated in the network of the circuit to be tested using simple algebraic relationships between input and output sensitivity values for each primitive gate. A logic value v on a lead "a" is sensitive if and only if (iff) the fault "stuck at $\bar{v}$" on lead "a" is observable, and likewise a logic value v on a lead "a" is insensitive iff the fault "stuck at $\bar{v}$" on lead "a" is unobservable. A sensitive 0 and 1 are denoted as $0+$ and $1+$, respectively. An insensitive 0 or 1 is denoted as $0-$ or $1-$. Referring to FIG. 3, the sensitive (and insensitive) values are indicated on a circuit receiving the vector $a=1$, $b=0$, $c=1$ (or 101 in short). The sensitive values, when complemented, are observable on the output lead, and the insensitive values, when complemented, are unobservable on the output lead. For any test vector applied to a network, each lead will assume one of four values: $0+$, $1+$, $0-$, or $1-$. As a whole these four values are called test values.

During testing, or equivalently applying a plurality of successive test vectors to detect specified faults, the total *numbers* of sensitive 0's and 1's that a lead "a" will assume are respectively denoted as $a_0+$ or a $a_1+$ and the total number of insensitive 0's and 1's are respectively denoted as $a_0-$ or $a_1-$. These four quantities $a_0+$, $a_1+$, $a_0-$, and $a_1-$ are called test counts. In the following context text $n_0+$, etc. is used to represent test counts for an arbitrary lead (provided there is no ambiguity). A test count matrix for a lead "a" is a $2\times 2$ matrix with $a_0+$, $a_1+$, $a_0-$, and $a_1-$ at upper left, upper right, lower left, and lower right corner, respectively. A $3\times 3$ test count matrix may also be used to carry extra information about the sum of each column and row. In this case, the $2\times 2$ matrix is exactly the upper left portion of the corresponding $3\times 3$ matrix. A typical matrix is illustrated in FIG. 5A.

Test counts on the inputs of a gate and test counts on the output of the same gate must satisfy certain relationships called constraints. Due to these constraints, changes of test counts on the input of a gate will cause changes on the test counts of the output, and this is called forward propagation. Conversely, change of the input test counts caused by a change of the output test counts is called backward propagation. Both forward and backward propagation are dictated by constraints as illustrated herein. An example of an AND gate is considered first. As illustrated in FIG. 4, whenever the output lead "c" of an AND gate is required to be $0+$, at least one of the input leads must be 0, which is sensitive iff the other inputs are $1-$. Since the two cases are mutually exclusive, it can be concluded that:

$$c_0+ \geq a_0{30} + b_0+ \qquad (1)$$

On the other hand, whenever one input lead is required to be $1+$, the output and the other input leads must all be $1+$. Hence, $$c_1+ \geq \max(a_1+, b_1+) \qquad (2)$$

Equations (1) and (2) are the constraints for test count forward propagation through an AND gate.

Backward propagation will also affect the test counts. A careful examination of all eight possible cases in FIG. 4 reveals that whenever an input lead is $1-$, either all other input leads are $0+$ or the output lead is $1-$. Since both cases are both mutually exclusive, there exists a constraint:

$$a_1- \geq b_1+ + c_1- \qquad (3)$$

Also, an input lead will assume $1+$ whenever the output lead or any other input leads are $1+$. Therefore, $$a_1+ \geq \max(b_1+, c_1+) \qquad (3a)$$

Obviously, by combining (2) and (3a), one can also derive $$a_1+ = b_1+ = c_1+ \qquad (4)$$

Equations (3) and (4) are constraints for AND gate backward propagation.

Likewise, constraints for all types of unary gates are similarly obtained. The corresponding constraints for an OR gate are listed below since they are used in subsequent examples. Constraints for an inverter are also quite straightforward. Equations (5) and (6) are constraints for OR gate forward propagation and (7) and (8) are for OR gate backward propagation.

$$c_1+ \geq a_1+ + b_1+ \qquad (5)$$

$$c_0+ \geq \max(a_0+, b_0+) \qquad (6)$$

$$a_0- \geq b_1+ + c_0- \qquad (7)$$

$$a_0+ = b_0+ = c_0+ \qquad (8)$$

For an XOR gate the original test counting technique did not address the propagation of individual sensitivity and logic values ($n_0+$, $n_1+$). For XOR gates, different combinations of sensitive counts ($n_0+/n_1+$) are possible on the output lead for the same input sensitive counts. However, the total sensitive value ($n_0+ + n_1+$) remains the same in each of the different combinations and equals the maximum total sensitivity values among the input leads. In test count propagation according to the procedure of the present invention, the total test count is divided equally on the XOR gate output lead. Thus, if the maximum of ($n_0+ + n_1+$) is ten, then the propagated test count on the output lead is given the value (5/5). Note FIG. 5B. Although other combinations are possible, this combination provides quite satisfactory results.

Figure 10:
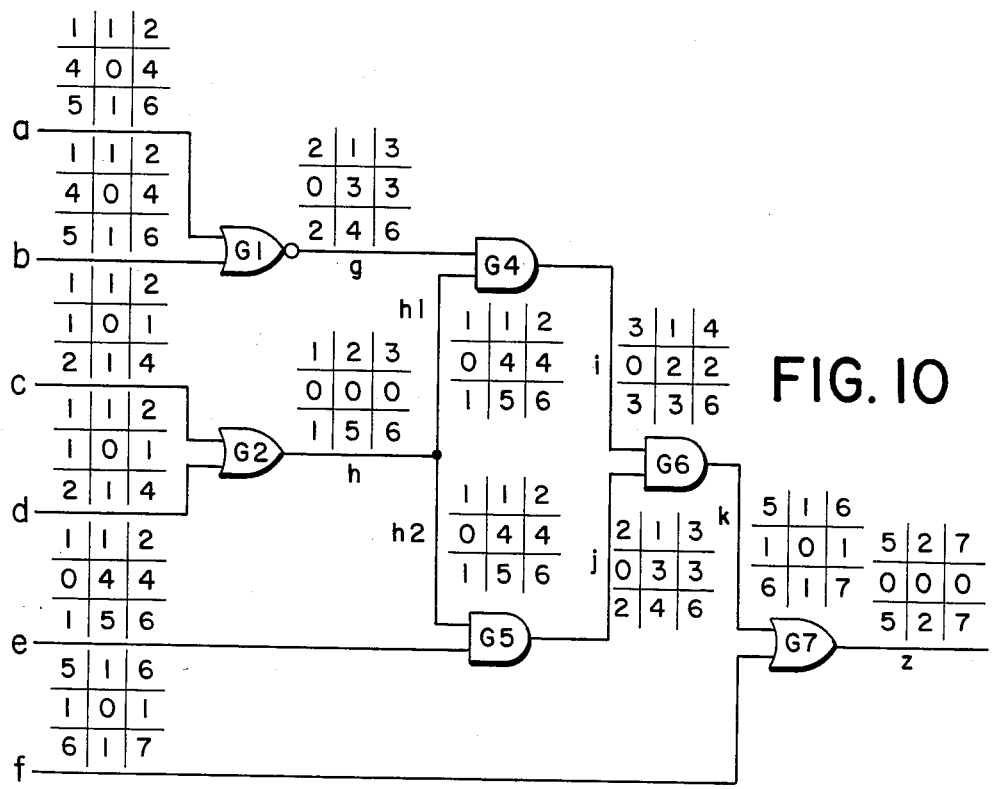

Utilizing the test counting procedure, test count matrices are derived for the various nodes in the circuit network that is to be tested. It can be assumed for purposes of illustration that all "stuck at" faults are to be detected (that is when a lead stays at the zero level or the one level regardless of the level the node should assume if the circuit were operating properly). In the propagation process, utilizing the constraints of expressions (1) through (8), as well as the XOR implementation suggested, a 1/1 may be initially assigned to each input lead of the network (indicating stuck at 0 and stuck at 1 faults or test counts of 1/1 for each input lead). The test counts are propagated forwardly and rearwardly. By way of example, test count matrices for a typical circuit are illustrated in FIG. 10 which have been derived in accordance with the aforementioned constraint formulas (1) through (8). As a result of the test counting procedure, called TMA or testability-measure analyzer in the procedure according to the present invention, the test counts for each of the nodes in the circuit are identified as well as the total number of input vectors required for testing stuck-at values. The total number of vectors required is seen to be seven from the test counts 5/2 on lead "z" in FIG. 10, wherein five test vectors will produce a zero output and two will produce a one output. The process for propagating test counts resulting in test count matrices of the type illustrated in FIG. 10 is more fully described in the aforementioned paper by Akers and Krishnamurthy. The test count matrix information is further utilized according to the present invention to define the test vectors by a test generation process of enumeration as hereinafter more fully described. Local enumeration is first performed for reconvergent fanout loops, and global enumeration is finally undertaken for the complete circuit.

During the test generation procedure, reconvergent fanouts may cause problems due to one or more of the following factors:

(a) Self-masking: The setting of a sensitive value on a branch might be masked off by the setting on the other branches such that the stem becomes insensitive.
(b) Multiple-path sensitization: In some cases, the stem could be sensitive while all the branches are insensitive.
(c) Redundancy: Some faults along the reconvergent path might not be detectable, whatever procedure is used.

For dealing with reconvergent fanouts during test generation, the introduction of stem analysis at this point will be helpful. Stem analysis deals with the relationships among the sensitivity values of the branches and the stem (or common input) by analyzing different configurations encountered in real circuits. The following terms, referring to the drawing of FIG. 6, are defined to help explain stem analysis:

D-path: A fanout path with sensitivity on both the branch and the reconvergent point. Note that the change of logic value on the branch will cause change on the reconvergent point (i.e., an input lead of the reconvergent gate). In other words, a D-path is always an enabled path. The symbol $n_D$ denotes the total number of D-paths in a reconvergent fanout.

ND-path: A fanout path with insensitivity on the branch and sensitivity on the reconvergent point. Note that the change of logic value on the branch will not cause change on the reconvergent point. In other words, an ND-path is always a disabled path. The symbol $n_{ND}$ denotes the total number of ND-paths in a reconvergent fanout.

U-path: A fanout path with insensitivity on both the branch and the reconvergent point. Note that a U-path can be either an enabled path or a disabled path and the change of logic value on the branch will cause change on the reconvergent point iff the path is enabled. The symbol $n_U$ denotes the total number of U-paths in a reconvergent fanout.

Also observe that for the input leads of a unary gate there are three possibilities of sensitivity distribution: none are sensitive, only one is sensitive, or all are sensitive. For an exclusive OR gate, either all are sensitive or all are insensitive.

When applying the above observations to a reconvergent gate, abbreviated as RG, the sensitivity of the stem S of the reconvergent fanout can be categorized into six possible cases as set forth in Table 1. In Table 1, $S+$ and $S-$ stand for sensitive and insensitive stems, respectively. The column "Partial" means that the reconvergent paths of a fanout account for a subset of input leads of the reconvergent gate or RG. The column "All" means that all the input leads of the RG come from the same fanout.

TABLE 1

Stem Analysis
Fanout Stem and Branches Sensitivity Propagation

| Case | $n_D$ | $n_{ND}$ | $n_U$ | Unary RG Partial | Unary RG All | XOR RG Partial | XOR RG All |
|---|---|---|---|---|---|---|---|
| 1 | =0 | =0 | >0 | $S-$ | $S+$ iff multiple-path sensitization $S-$ otherwise | $S-$ | $S-$ |
| 2 | =0 | >0 | =0 | $S-$ | $S-$ | $S-$ | $S-$ |
| 3 | =0 | >0 | >0 | $S-$ | $S-$ | N.A. | N.A. |
| 4 | >0 | =0 | =0 | $S+$ | $S+$ | $S+$ iff $n_D$ is odd $S-$ otherwise | $S+$ iff $n_D$ is odd $S-$ otherwise |

TABLE 1-continued

Stem Analysis
Fanout Stem and Branches Sensitivity Propagation

| Case | $n_D$ | $n_{ND}$ | $n_U$ | Unary RG Partial | Unary RG All | XOR RG Partial | XOR RG All |
|---|---|---|---|---|---|---|---|
| 5 | =1 | =0 | >0 | $S^-$ iff some U-paths enabled $S^+$ otherwise | $S^-$ iff some U-paths enabled $S^+$ otherwise | N.A. | N.A. |
| 6 | >0 | >0 | =0 | $S^+$ | $S^+$ | $S^-$ iff $n_D$ is even $S^+$ otherwise | $S^+$ iff $n_D$ is even $S^+$ otherwise |

To carry out test vector generation by enumeration, sensitivity drives and insensitivity drives must also be understood. Referring to FIG. 7, forward sensitivity drive is illustrated for different types of gates. The input lead circled is the "driving" lead, and all uncircled leads are the "driven" leads. For instance, if the driving lead of an AND gate is individually required to be 0+, all other driven input leads must be set to 1− and the driven output lead must be 0+. Sensitivity drive is employed to determine individual sensitivity values used to form the test vectors.

Figure 9:
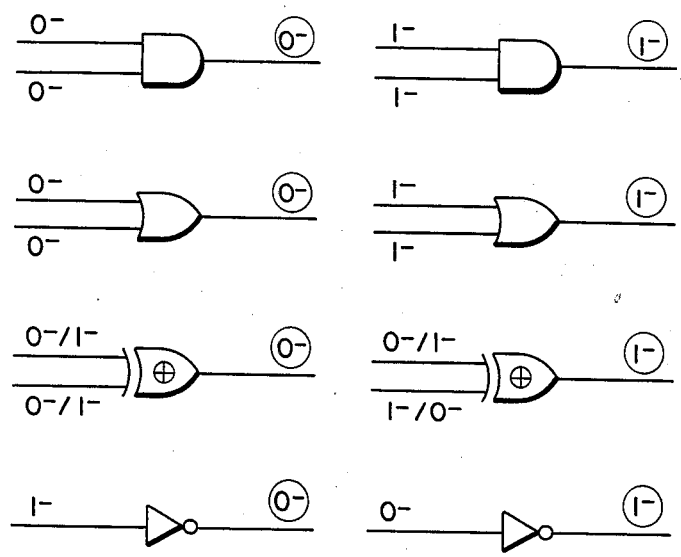

As in the case of forward and backward propagation of test counts, forward and backward sensitivity drives are also utilized with FIG. 8 illustrating backward sensitivity drive and FIG. 9 illustrating backward insensitivity drive. Note that there is no forward insensitivity drive. As will hereinafter be more clearly understood by way of example, a selected input lead for either a reconvergent fanout loop, or the circuit as a whole, is designated as a driving lead and the value is "driven" towards the reconvergent gate or common output. Then, the individual sensitivity and insensitivity values are driven rearwardly. After the process is completed with global enumeration, a number of partial solutions will have been accumulated (and stored) for defining the nature of the minium usable number of test vectors.

The test generation process of enumeration according to the present invention, starting with "local enumeration" will be conceptually explained with the aid of the schematic diagrams of FIGS. 10 through 19. It will be understood the actual process is carried out on a general purpose digital computer in accordance with circuit simulation, but it is desirable to comprehend the salient features of the process with respect to a typical example.

As indicated above, TMA (testability-measure analyzer comprising known test counting procedures) is invoked before local enumeration to obtain the testability information, i.e., the test count matrices used in the local enumeration. Securing this information for a given circuit, such as illustrated in FIG. 10, is designated for convenience as step 0 of the procedure. As will be understood, the circuit of FIG. 10 is merely representative of a gate network and it is utilized as a simple example of an integrated circuit organization to which the process according to the present invention may be applied. This circuit includes input terminals or nodes a through f, a common output terminal or node z, and intermediate nodes g, h, i, j and k. Inputs a and b are connected to NOR gate G1, the output of which drives AND gate G4 at node g. Similarly, inputs c and d are connected to OR gate G2 having an output at node h supplying common inputs h1 and h2 of AND gates G4 and G5. The outputs of AND gates G4 and G5 drive AND gate G6 at nodes i and j, while the output of gate G6 at node k provides one input for OR gate G7, the latter driving output node z. Inputs e and f are connected respectively in driving relation to AND gate G5 and OR gate G7.

In the example circuit given in FIG. 10, a single primary output at node z for the overall circuit is illustrated, but it will be understood that for more complicated circuits the network is petitioned into cones. See "Test Generation for Large Logic Networks" by Bottorff, France, Garges, and Orosz, Proceedings 14th Design Automation Conference, June 1977, pages 479–485. For each cone, test count matrices for all leads in the cone are established. Subsequently, vectors generated by final enumeration for all cones are regrouped or merged to produce a complete test set in a manner understood by those skilled in the art.

The circuit starting with node h, and including AND gates G4 and G5 connected in driving relation to AND gate G6, is termed a reconvergent fanout loop wherein gate G6 is the reconvergent gate, and node h is the stem. The preliminary test counting procedure, the results of which are exemplified by the test count matrices in FIG. 10 does not precisely handle reconvergent fanout. However, the test counting procedure provides preliminary test counts for input leads of the fanout loop as well as for leads outside the fanout loop. Local enumeration is employed, interalia, to restore any missing information, with the test counts being reassessed at the end of local enumeration. For local enumeration of a fanout loop, a set of partial solutions is produced to manifest the propagational behavior of the loop. For those leads with resultant test counts greater than the initially generated test counts, related test counts are adjusted to reflect newly-restored information. It should be realized that in the presence of logic redundancy, some faults will never be detectable. A legitimate result of the procedure is that manufacture of a given circuit might be undesirable.

Figure 11:
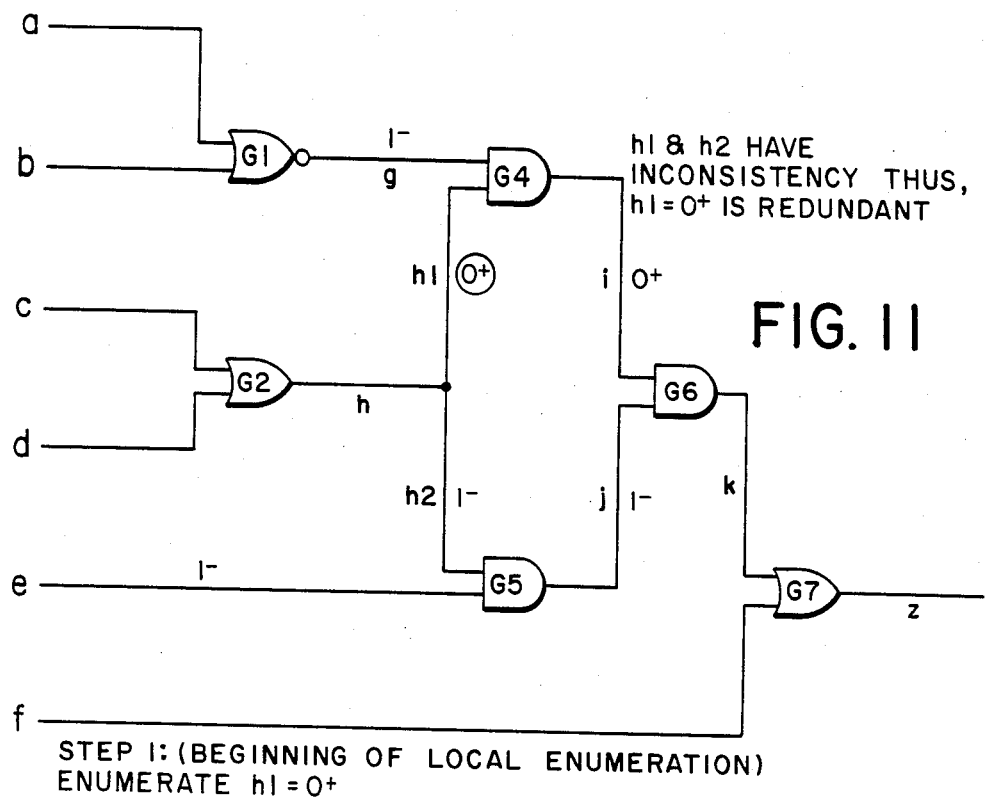

Local enumeration is first employed with respect to the reconvergent fanout loop between nodes h and k. The same circuit as illustrated in FIG. 10 is repeated in FIGS. 11 through 19 for explaining local enumeration, as well as in subsequent figures for explaining global enumeration. FIG. 11 is designated as step 1 of local enumeration for this loop where node h1 is enumerated for 0+ (encircled) by employing the forward sensitivity drive indicated in FIG. 7 as well as the backward sensitivity and insensitivity drives of FIGS. 8 and 9. The sensitivity value 0+ on lead h1 is driven forwardly to reconvergent gate G6 and backwardly resulting in the sensitivity and insensitivity values noted on the leads in FIG. 11 associated with the fanout loop. It is seen that leads h1 and h2 have an inconsistency using this procedure, and therefore h1=0+ is considered redundant.

Figure 12:
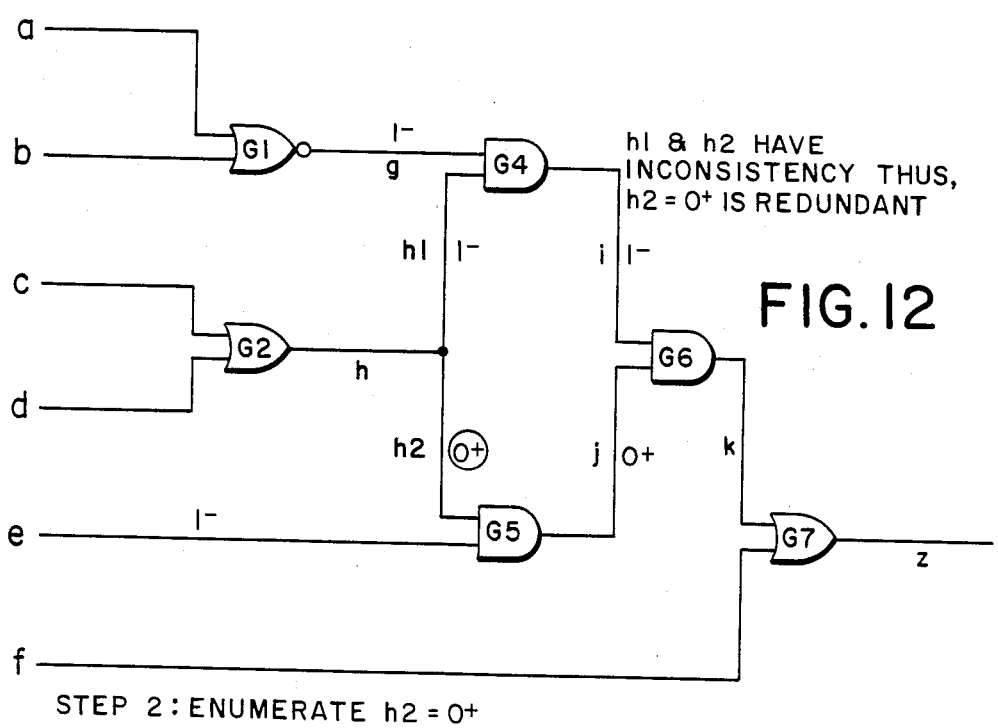

In FIG. 12, step 2 of local enumeration, the procedure enumerates h2=0+. Again utilizing the sensitivity and insensitivity drives of FIGS. 7 through 9, the individual sensitivity and insensitivity values on the various leads associated with a reconvergent fanout loop are ascertained. Again, h1 and h2 have an inconsistency and therefore h2=0+ is redundant.

In some instances such a reconvergent fanout loop may not be testable. However, a reconvergent fanout loop is completely testable iff all its branches and adjacent leads are completely testable (i.e., the existence of 0+ and 1+ can be verified). Once an undetectable fault is spotted, all the equivalent faults (if any) can also be located.

Figure 13:
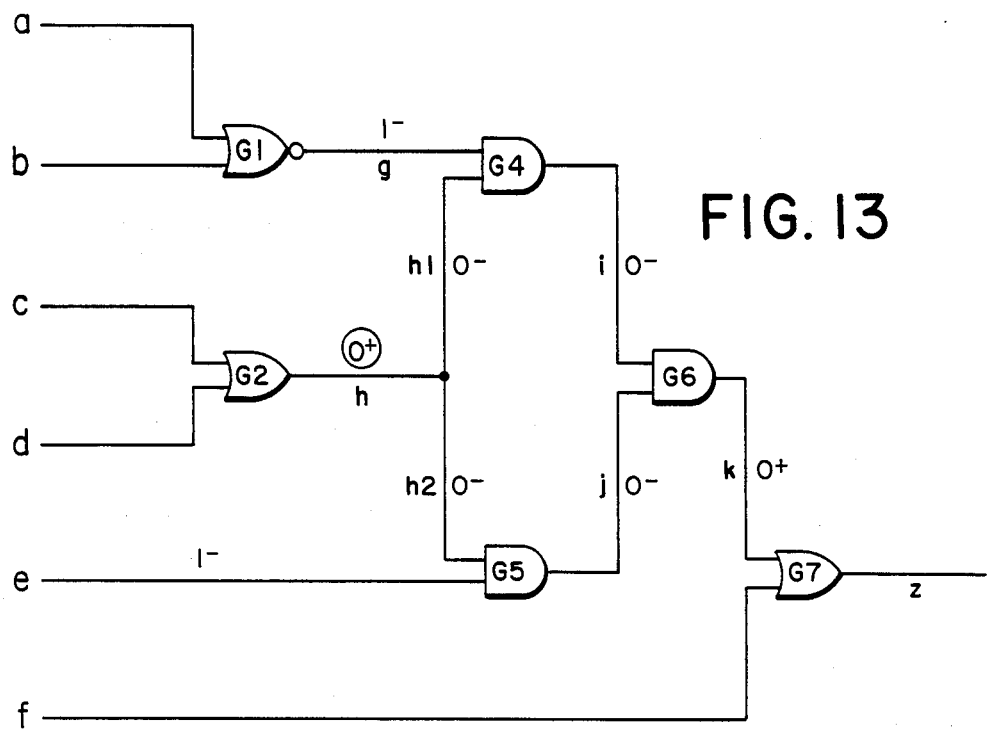
Figure 14:
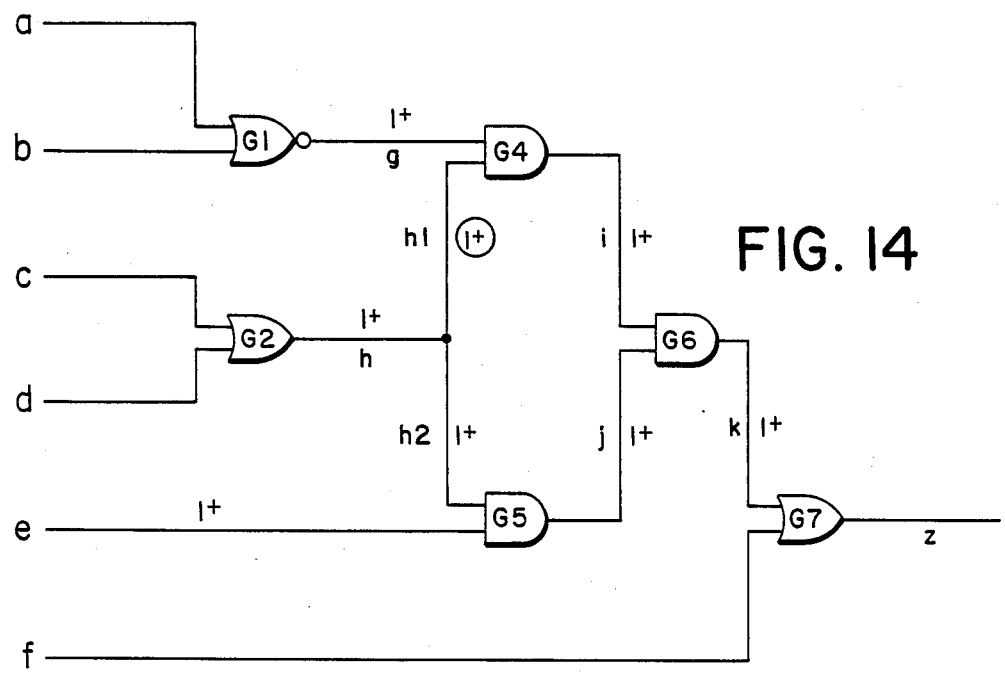

In the case of redundancy, the nonexistence of sensitivity values does not imply an undetectable stem. Steps 1 and 2 in FIGS. 11 and 12 show that h1=0+ and h2=0+ do not exist. However, the possibility of multiple-path sensitization could still make the stem h=0+ detectable. Referring to FIG. 13, i.e., step 3 of the example local enumeration process, the multiple-path sensitization condition can be met iff the reconvergent paths account for all input leads of the reconvergent gate, and if they are all enabled U-paths. (Note FIG. 6 and Table 1 for stem analysis, and particularly case 1.) The enumeration in FIG. 13, step 3 meets these conditions, and therefore multiple-path sensitization can make the stem h=0+.

Thus, the existence of 0+ and 1+ on every branch is first verified to provide an early indication of redundancy. All adjacent leads along the reconvergent paths must also be verified for the existence of 0+ and 1+. In the case of redundancy, it is possible to determine the sensitivity of the stem is undetectable, but on the other hand it may be possible to determine multiple-path sensitization. Proceeding to FIG. 14, step 4 of local enumeration, we then enumerate h1=1+. It is seen no inconsistency results from sensitivity drive as resulting in the sensitivity values noted in FIG. 14. Next, node g is enumerated in FIG. 15, step 5 for g=0+. In FIG. 16, step 6, we enumerate e=0+ with the results indicated on the various leads associated with the reconvergent fanout loop.

Figure 17:
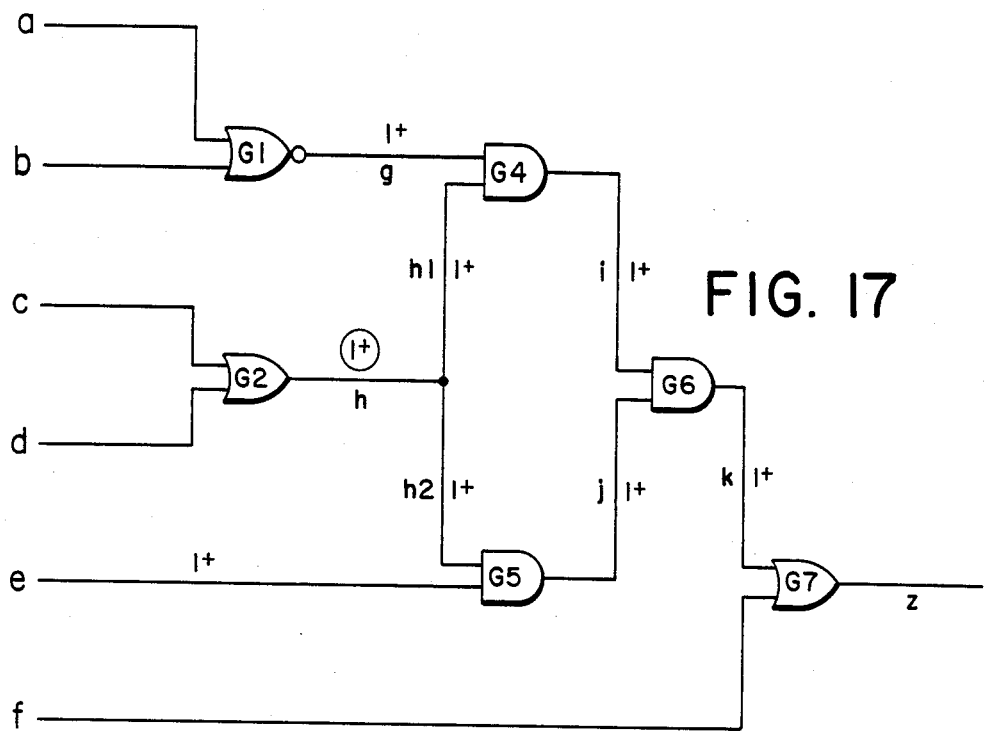

In FIG. 17, step 7, the partial solution from step 4 is duplicated to satisfy the extra requirement on node h by the test count matrix associated with node h as illustrated in FIG. 10. That is, according to the test count matrix, the test count for a sensitivity value of 1+ on node h is two, and thus far only one such individual sensitivity has been accumulated in steps 1 through 6.

Figure 15:
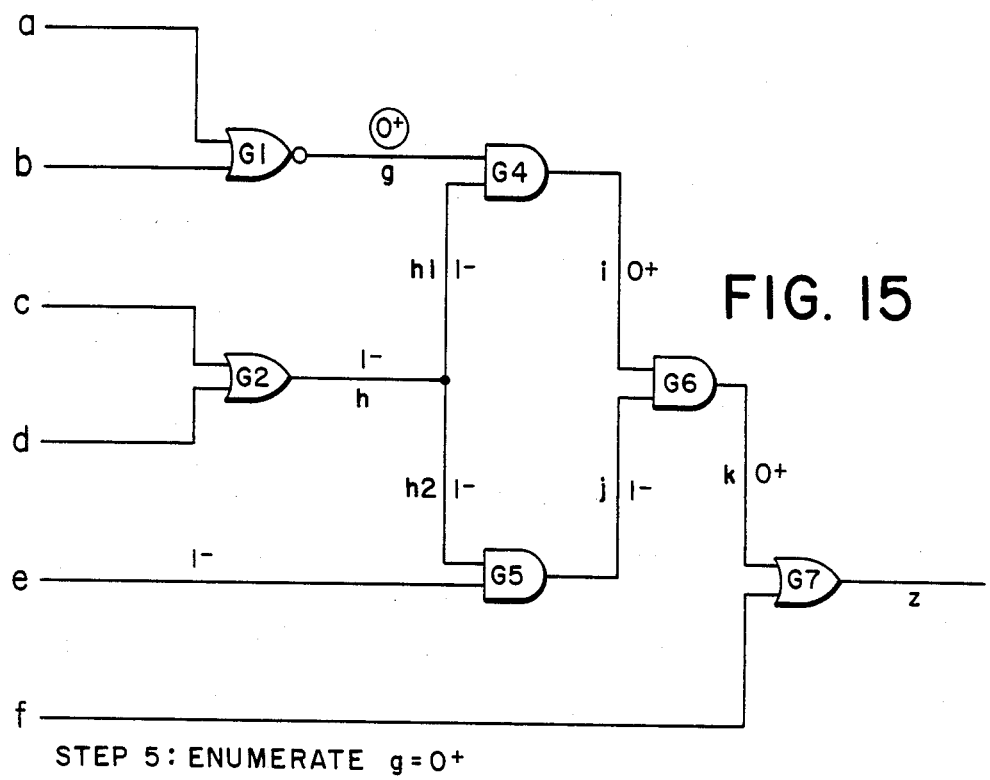
Figure 16:
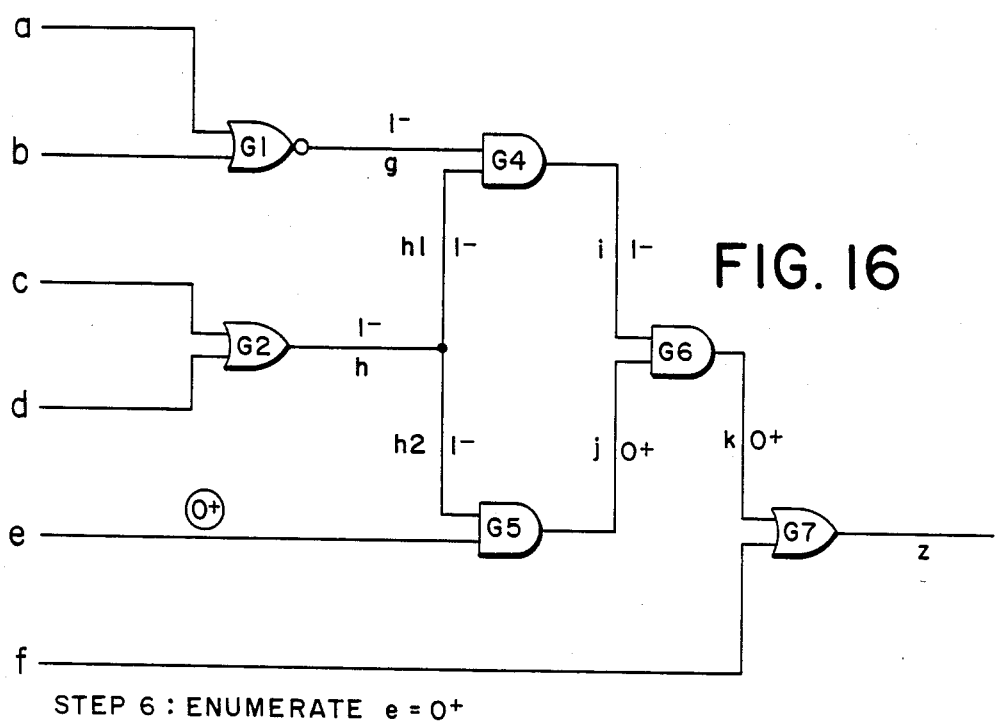
Figure 18:
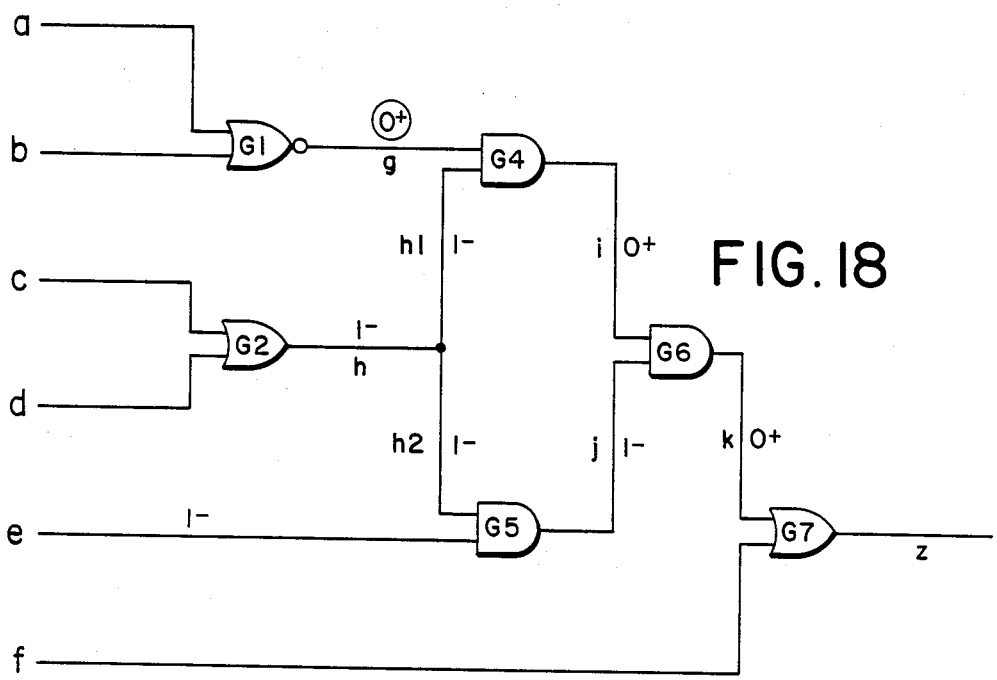

Similarly, in step 8, FIG. 18, the partial solution from step 5, FIG. 15, is duplicated to satisfy the extra requirement on node g, since it will be seen that the test count matrix in FIG. 10 for node g indicates two counts for the 0+ sensitivity value.

By step 8 of FIG. 18, various sensitivity drives have been employed at the various branch and other inputs of the reconvergent fanout loop until the numbers in the test count matrices for the loop are satisfied to the extent possible taking redundancy into consideration. The solutions associated with the steps, i.e., the sensitivity and insensitivity values associated therewith, are stored.

Figure 19:
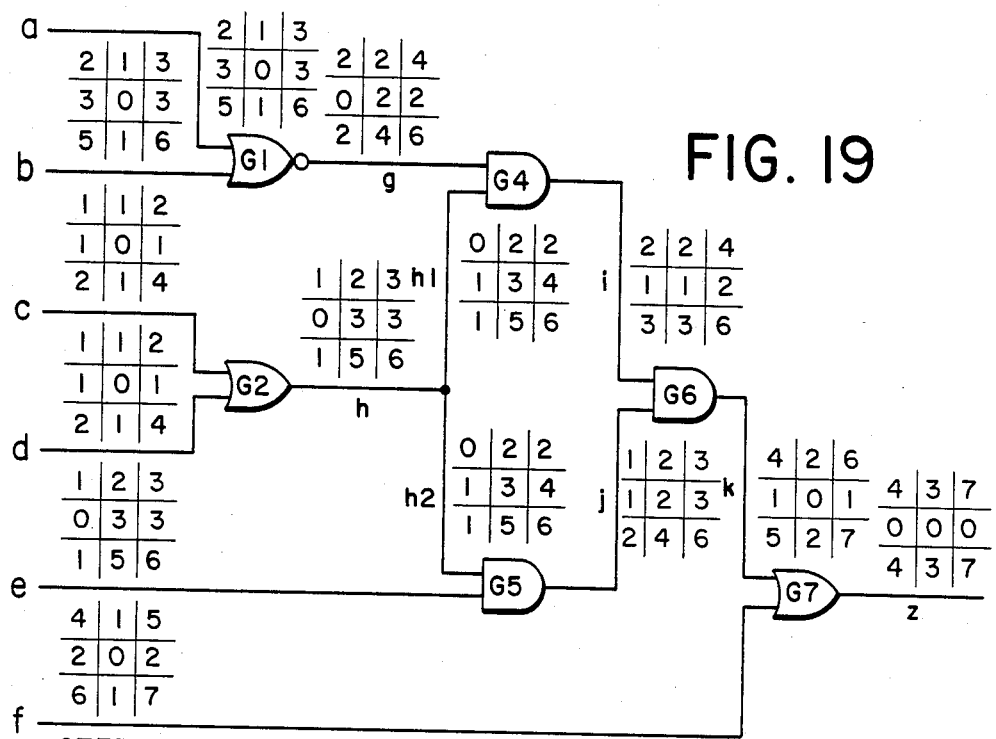

In FIG. 19, the test count matrices for the reconvergent fanout loop are adjusted with redundant counts set to 0. The TMA or test counting propagation, forward and backward, is repeated. Thus, it will be noted that the test counts at lead h1 and lead h2 for sensitivity 0+ are set to 0 in each case. The second run of TMA adjusts the remaining test count matrices accordingly employing the constraints set forth in relations (1) through (8) as hereinbefore explained.

In the circuit herein illustrated by way of example, only one reconvergent fanout loop is present. Of course if more than one such loop is encountered, a local enumeration is performed for each loop. If one loop is located within another, local enumeration is first undertaken for the innermost loop.

Following local enumeration and the second run of TMA (FIG. 19), global enumeration is undertaken to supply the test vectors required at the input terminals to satisfy the test counts of the test count matrices resulting from the second run of TMA in FIG. 19. Global enumeration is illustrated for the circuit in FIGS. 20 through 26.

Figure 20:
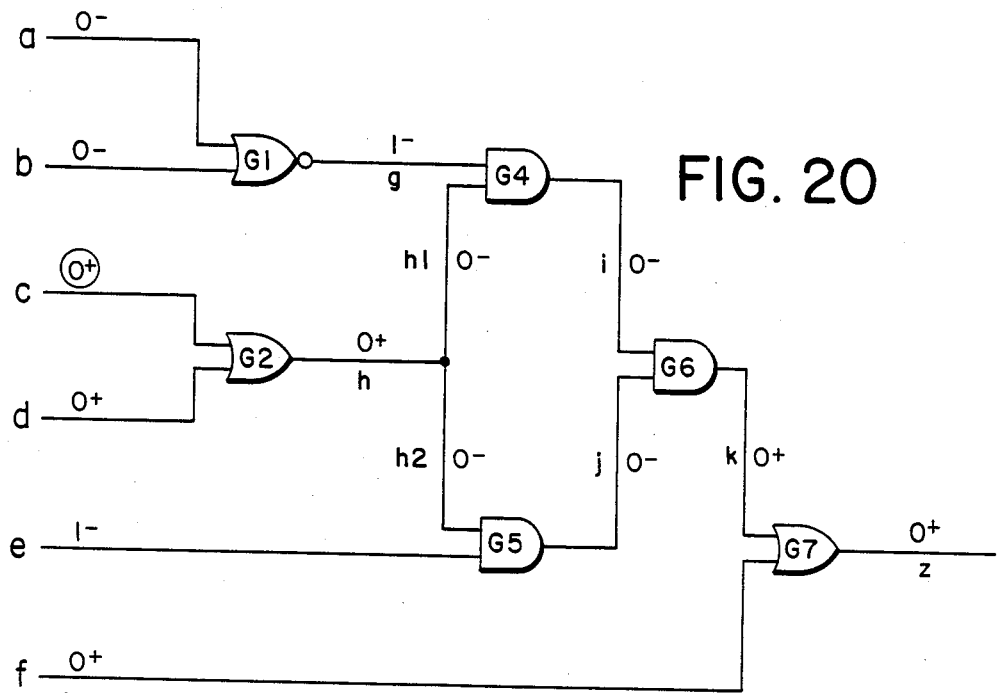

Referring to FIG. 20 (step 10 of the overall procedure), the circuit is driven (in accordance with sensitivity drives illustrated in FIG. 7) from c=0+, the c and d inputs being farthest from the primary output at z. Driving this sensitivity value forwardly and rearwardly in accordance with the drives illustrated in FIGS. 7-9 results in the values at the various nodes as illustrated in FIG. 20. In part, the partial solution from step 3 (FIG. 13) is adopted for the reconvergent fanout loop inasmuch as node h has a sensitivity value 0+, The other nodes in this circuit are assigned values agreeing with the sensitivity and insensitivity drive.

Figure 21:
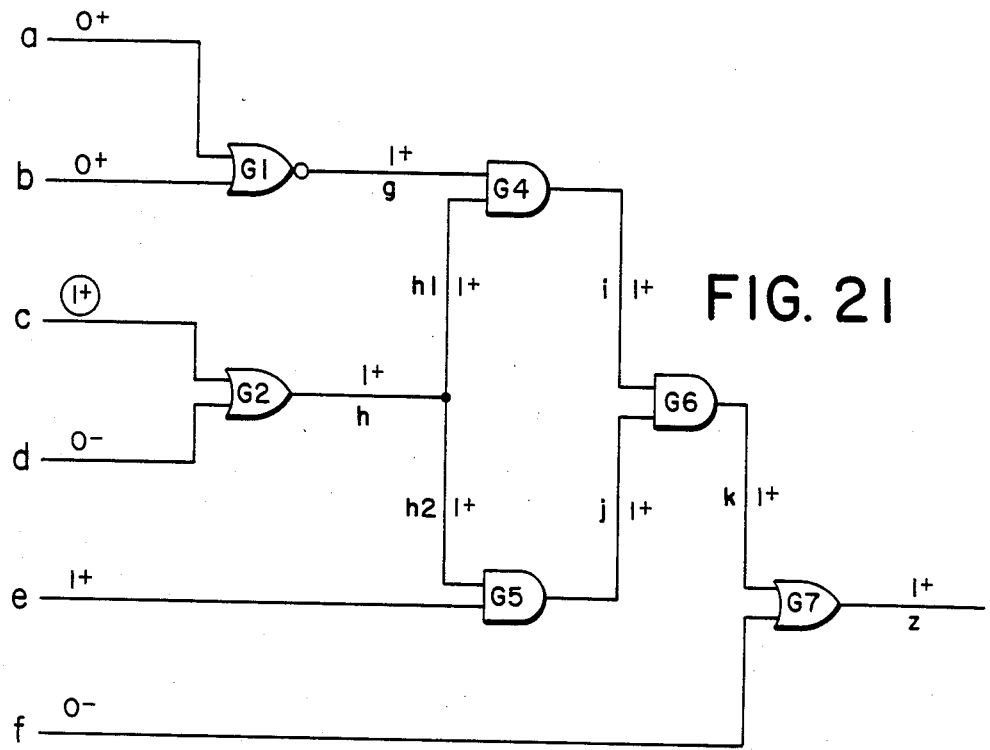
Figure 22:
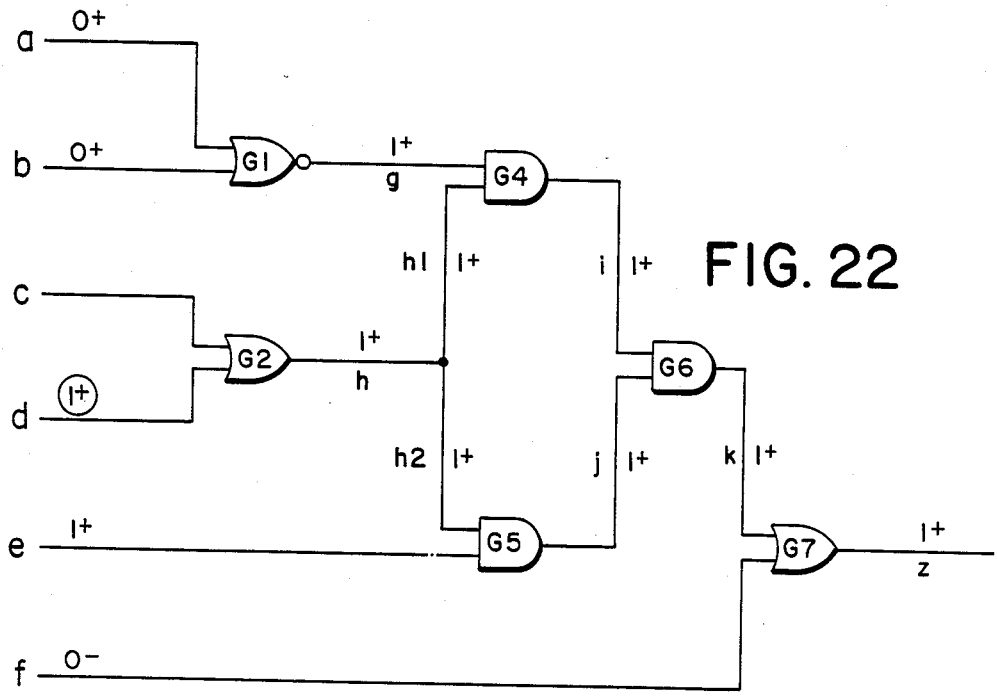
Figure 23:
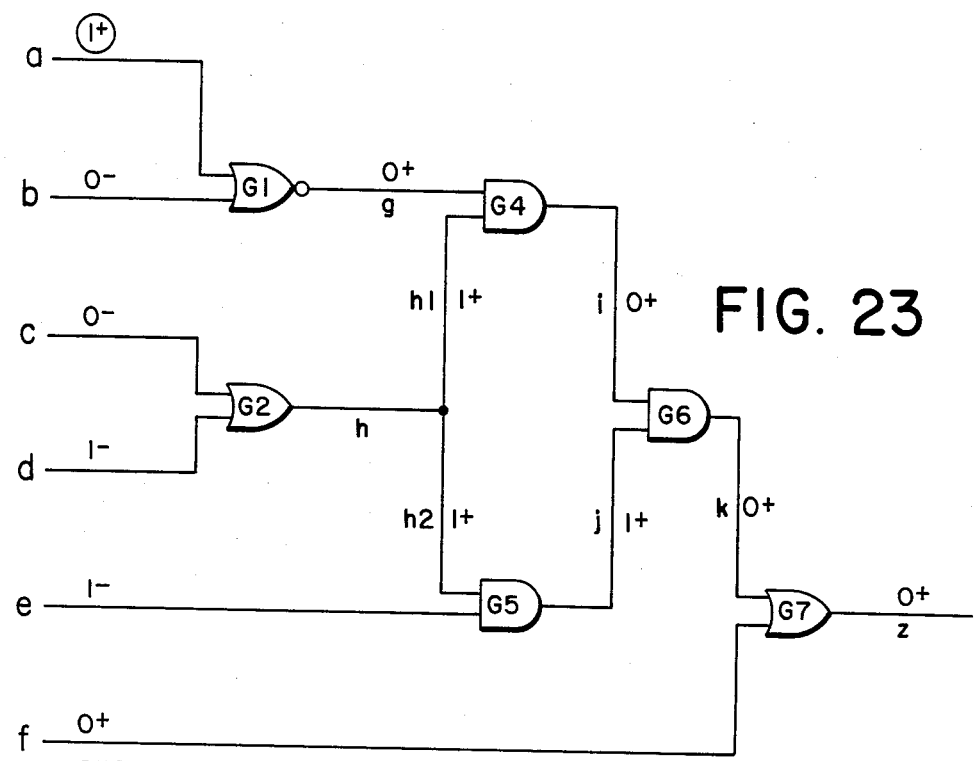
Figure 24:
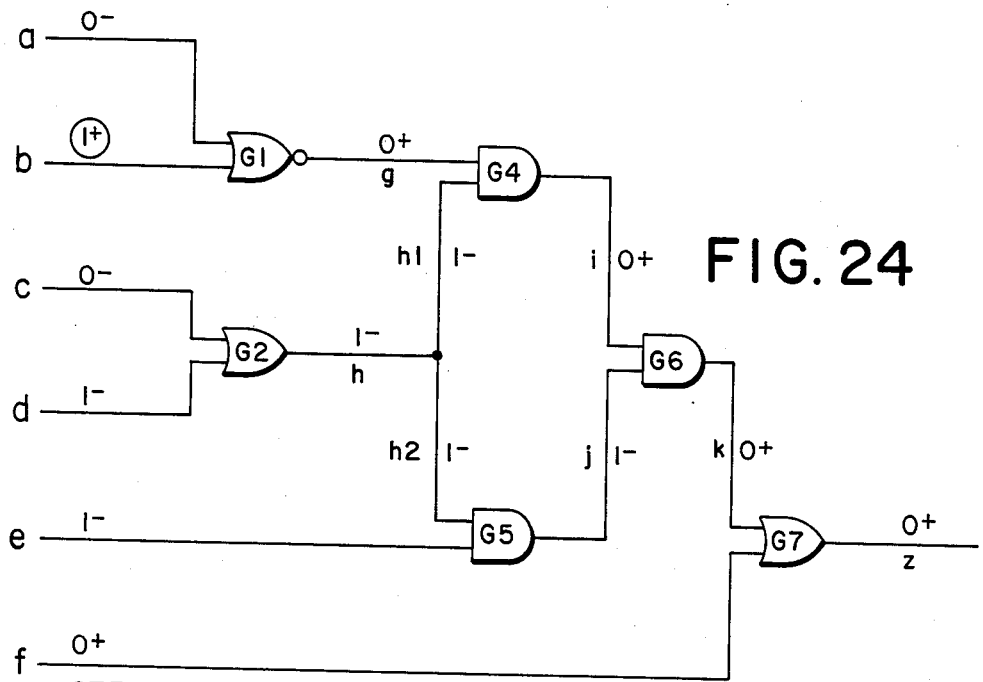

In step 11 of FIG. 21, we drive from c=1+ and adopt the partial solution from step 4 for the fanout region. Similarly, in step 12 (FIG. 22) we drive from d=1+ and adopt the partial solution from step 7 for the fanout region, while in step 13 (FIG. 23) we drive from a=1+ adopting the partial solution from step 5. In step 14 (FIG. 24) we drive from b=1+ and adopt a partial solution from step 8 for the fanout region. In step 15 (FIG. 25) the drive is from e=0+, with adoption of the partial solution from step 6. In step 16, drive is from f=1+, and we copy the solution from step 12 (FIG. 22) but with all sensitivity changed to insensitivity to satisfy k=0−.

The partial solutions represented by steps 10 through 16 (FIGS. 20 through 26) are stored in memory, i.e., the sensitivity and insensitivity values at each node in each set for a separate selected input drive are suitably stored in memory. It will be noted the various partial solutions (represented in FIGS. 20 through 26) satisfy the test count matrices as set forth in FIG. 19 representing the second run of TMA. The various successive drives selected either themselves satisfy test counts, or drive other leads to satisfy test counts, until the total test counts are accumulated in sum of the partial solutions. In every case, it is not necessary to drive every specific input node with every sensitivity and insensitivity value represented by the test count matrices, because, as will be seen from review of the referenced figures, the drive by one sensitivity or insensitivity value will frequently dictate the sensitivity or insensitivity values for other input nodes which in accumulation will satisfy the test counts.

Figures 27, 29:
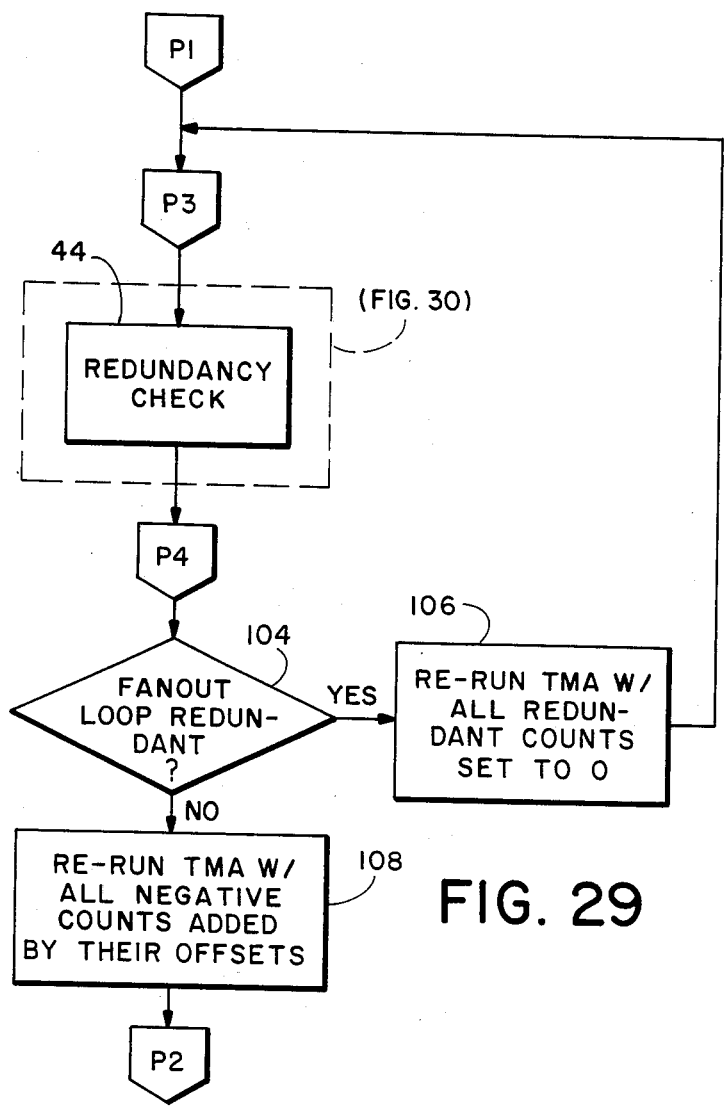

The complete test set for the foregoing procedure is illustrated in FIG. 27, i.e., seven test vectors at the left hand side of the vertical line in the drawing. The sensitivity drives hereinbefore utilized are again illustrated as encircled for convenience of comparison.

Referring to the test set of FIG. 27, the total sensitivity and insensitivity values which will occur at a particular node when the given input test vectors (at the left hand side of FIG. 27) are applied should correspond to the test counts for that node in FIG. 19. For instance, according to the test count matrix for the node j in FIG. 19, node j should assume $0^+$ once, $1^+$ twice, $0^-$ once and $1^-$ twice. It is seen from column j in FIG. 27 that these requirements are met in the test set derived. Based upon the test counts, fault coverage is known without conventional fault simulation. Note that the primary output lead z will at least take $0^+$ four times and $1^+$ three times, or in other words it is confirmed that seven input vectors are employed to test the circuit illustrated.

The test generation method described thus uses the testability information directly to create test vectors. The physical meaning of the test count matrix on each lead is interpreted to provide requirements on that lead in terms of the number of sensitizations and insensitizations. The correct combination of test vectors is supplied by driving sensitivity values at individual input leads forwardly and backwardly in the circuit network to provide sensitivity and insensitivity values for the rest of the network, with each such drive usually forming a stored partial solution defining a test vector. The partial solutions, including the test vectors, are suitably stored one at a time and the process is repeated until all the test counts are exhausted. As a result, a set of vectors is obtained satisfying the specified requirements. Test generation in this manner comprises a method of obtaining solutions which are known to exist, in contrast to most previous test generation algorithms that blindly search for a solution.

Although it is suggested the above partial solutions be conducted sequentially, it is noted that each enumeration process (local and global) is independent of the others. In other words, the method is suitable for concurrent processing to obtain the various test vectors if so desired.

Reference is now made to FIGS. 28 through 32 comprising a flowchart descriptive of software for use in carrying out local enumeration. As will be recalled, local enumeration is concerned with providing partial solutions for reconvergent fanout loops and represents the first portion of the overall enumeration process. That is, partial solutions for reconvergent fanout loops within a circuit are undertaken prior to final or global enumeration.

Figure 28:
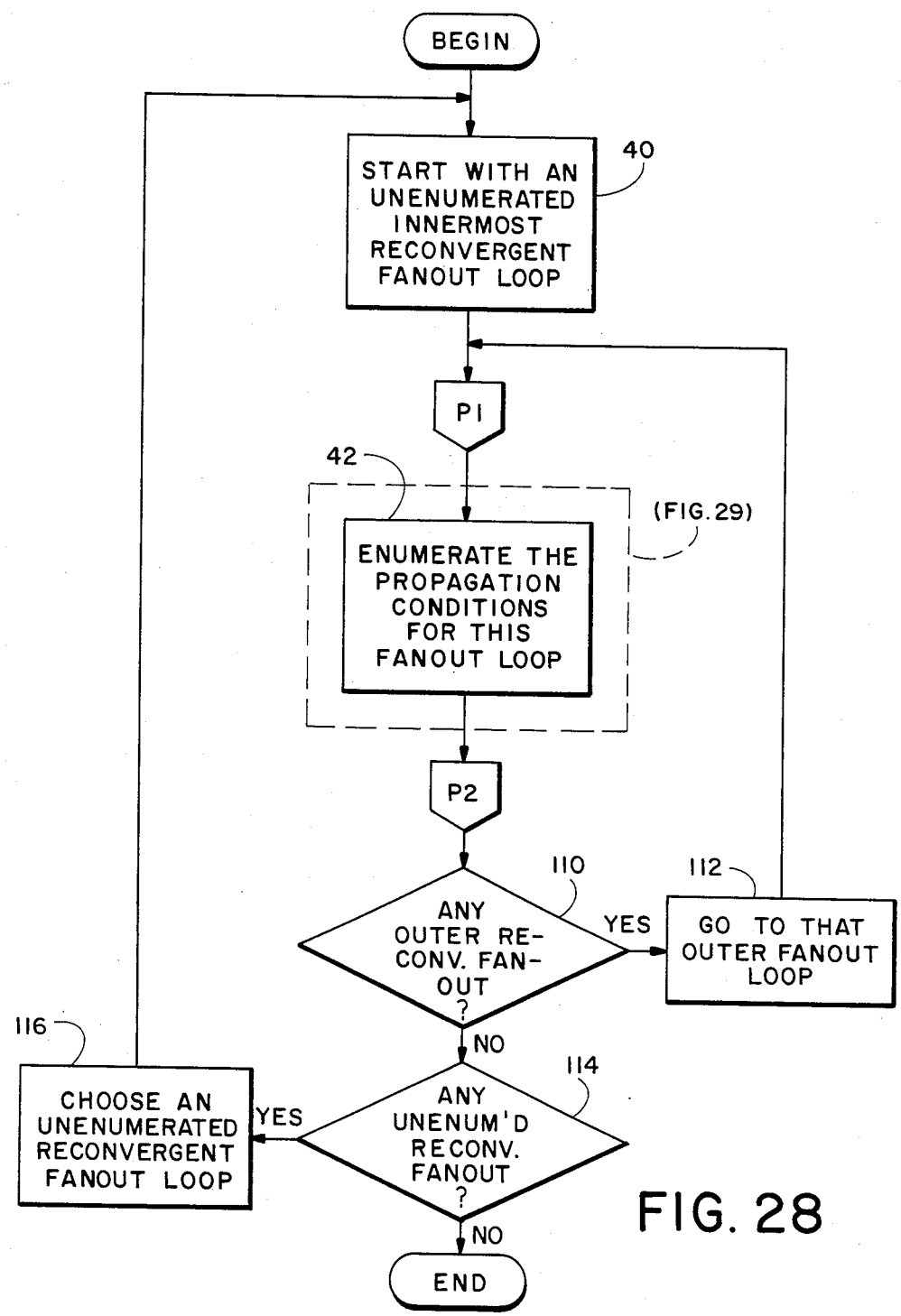

Referring first to FIG. 28, the process starts with an unenumerated innermost reconvergent fanout loop as indicated by block 40. Thus, utilizing the computer simulation of the circuit itself, an innermost reconvergent fanout loop is selected. The program then proceeds to the routine "Enumerate the propagation conditions for this fanout loop" indicated by block 42 in FIG. 28, this routine being further described between P1 and P2 in FIG. 29. Referring to FIG. 29, it is seen program flow is directed to the routine "Redundancy check" 44 between the designations P3–P4 in FIG. 30.

Figure 30:
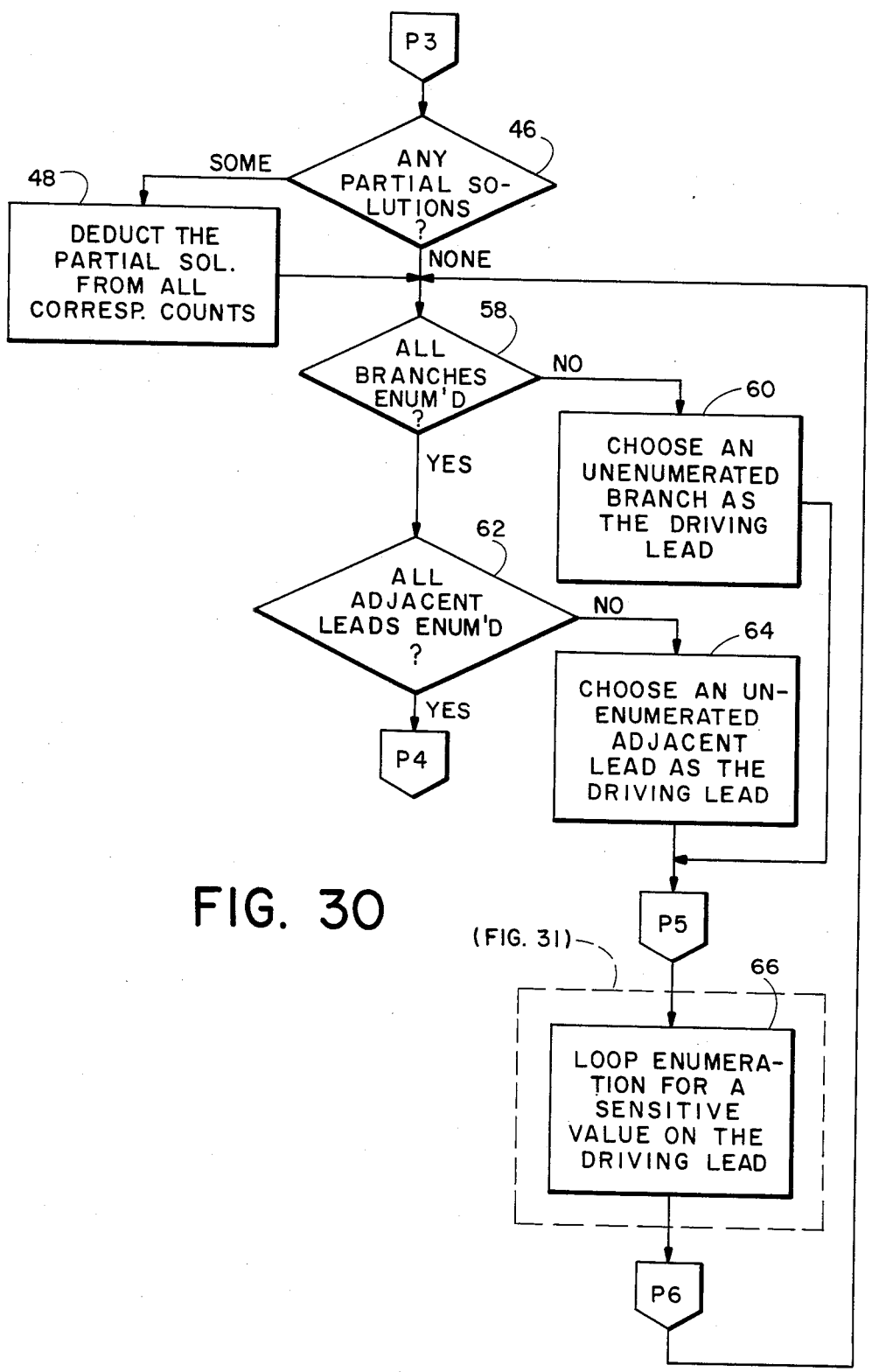

Referring to FIG. 30, the decision block 46 is entered to ascertain whether any partial solutions have heretofore been produced. For the first run, the result will usually be "None". However, if some partial solutions have already been formulated as would account for some of the test counts for nodes associated with a particular reconvergent fanout loop, the partial solutions are subtracted from all corresponding counts. For instance, referring to the test count matrix of FIG. 5A, if a partial solution for the given node includes a sensitivity value $1^+$, the numeral one in the top middle column of the matrix of FIG. 5A would be temporarily reduced to zero, indicating the extent to which this count of the test count matrix has been satisfied by the partial solution.

In any case, the program flow is next directed to decision block 58 where it is determined whether those leads which branch from a common stem have been enumerated. If all branches have not been enumerated, an unenumerated branch is chosen as the "driving" lead (for sensitivity drive per FIG. 7 in block 60. If all branches have been enumerated, then decision block 62 is entered for determining whether all adjacent leads have been enumerated. An adjacent lead for a reconvergent fanout loop comprises for example leads g or e in FIG. 10. If the answer is again yes, then return is made at P4 to FIG. 29. If the answer is no, an unenumerated adjacent lead is chosen in block 64 of FIG. 30 as the driving lead for sensitivity drive as illustrated in FIG. 7. In general, input leads are chosen in block 60 and 64 starting with the deepest branch, i.e., the branch (or adjacent lead) farthest from the reconvergent gate. Then leads closer to the reconvergent gate are chosen by successive closeness for the application of sensitivity values which as yet have not occurred and required to satisfy the test count on the particular driving lead. Among leads having the same distance from the reconvergent gate, such inputs are taken in arbitrary order or consecutive order.

Figure 31:
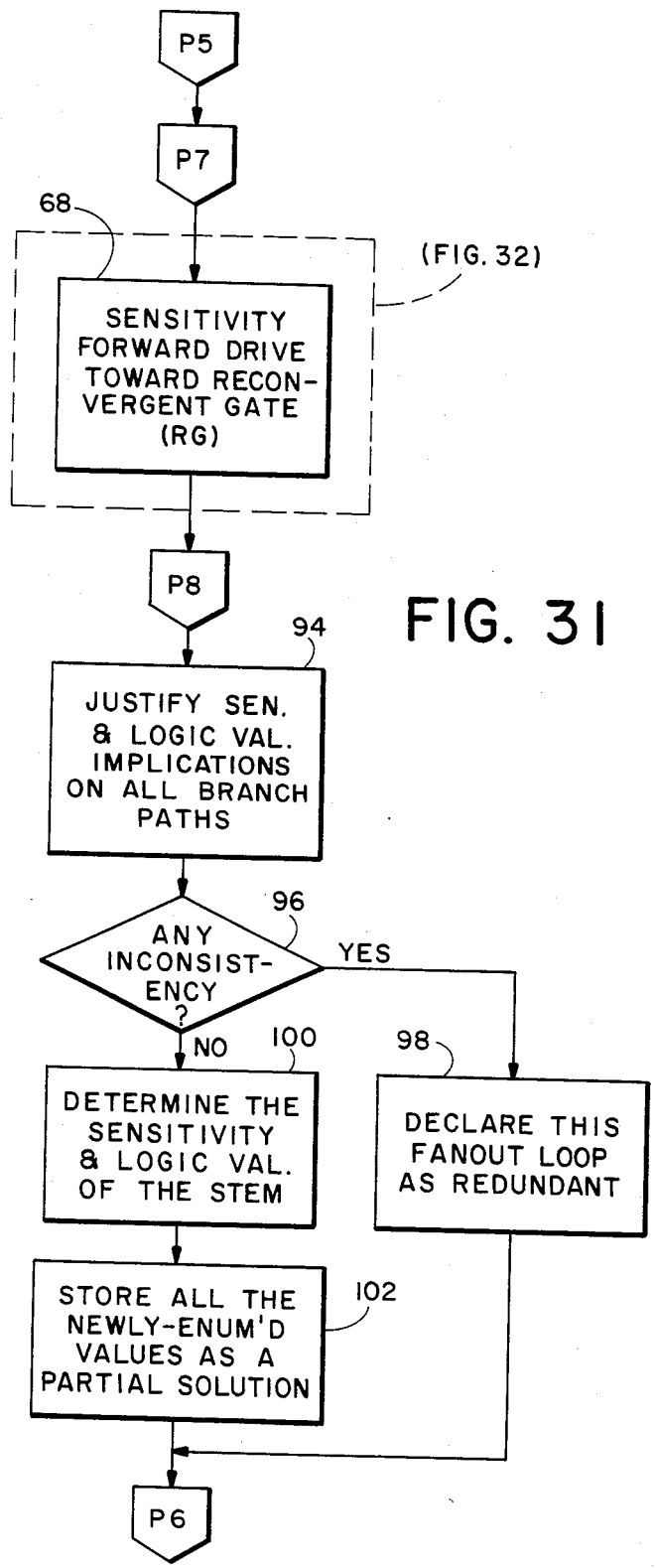

At point P5 in FIG. 30, the program proceeds to the "Loop enumeration for a sensitive value on the driving lead", routine 66 in FIG. 31 between points P5 and P6. Referring to FIG. 31, program flow is further directed to the subroutine "Sensitivity forward drive toward reconvergent gate (RG)" 68 between points P7–P8 in FIG. 32.

Figure 32:
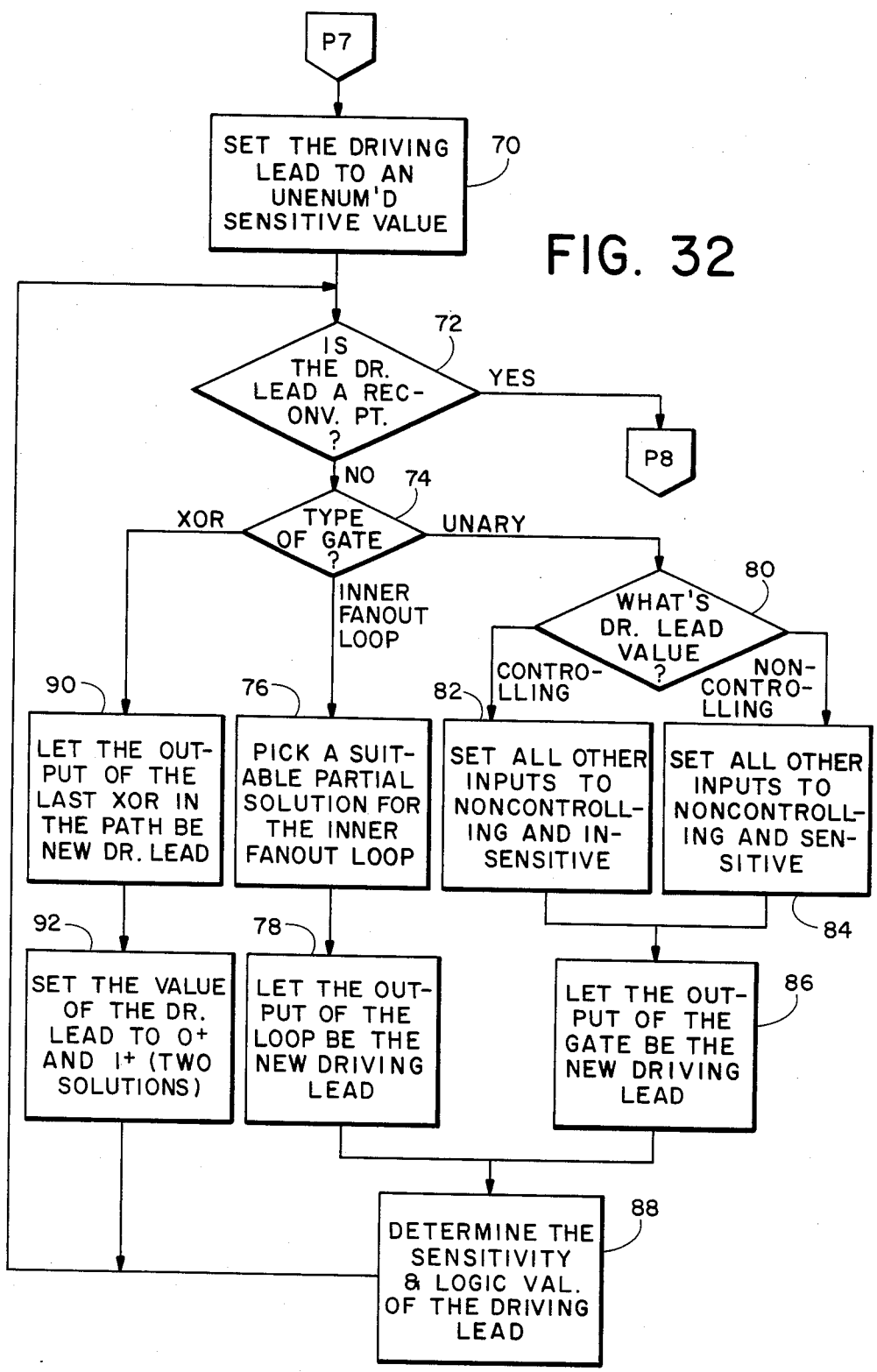

Referring now to FIG. 32, in block 70 the selected driving lead is set to an unenumerated sensitivity value, i.e., $0^+$ or $1^+$. In decision block 72, the determination is made whether this driving lead is a reconvergent point, i.e., at the end of a reconvergent fanout loop. If the answer is yes, return is made to the program of FIG. 31 via point P8. On the other hand, if the answer is no, then decision block 74 is entered. It is understood the forward sensitivity drive per FIG. 7 proceeds from gate to gate with the input of a gate being considered the driving lead until the reconvergent point is reached. In decision block 74, it is determined whether the driving lead is an input to a XOR gate, a unary gate, or an inner fanout loop. In the third instance, it is considered the present run of the routine may be for an outer reconvergent fanout loop encompassing an inner loop which has already been enumerated. Then, in block 76, a suitable partial solution, theretofore obtained and stored, is adopted, as hereinbefore indicated, for example, with reference to FIGS. 20 through 25. The partial solution adopted is one which will agree with the present solution or process for nodes up to said inner loop. Then, in block 78, the output of the inner loop dictated by such partial solution is chosen to be the new driving lead. After block 78, the program proceeds to block 88 wherein the sensitivity of the new driving lead is determined in accordance with such partial solution.

Returning to decision block 74, if the type of gate being driven is a unary gate (a unary gate is a AND gate, OR, NAND, NOR, or NOT logic element), a determination is made in decision block 80 regarding the driving lead value, i.e., whether it is "controlling" or "non-controlling". A controlling driving lead value is a logic value which solely determines the output of the gate. Thus, for example, a $0^+$ sensitivity at the input to an AND gate is controlling when all the other sensitivity inputs to such AND gate are $1^-$. A driving lead value is non-controlling if the logic value does not solely determine the output of the gate. Thus, a $1^+$ input to an AND gate is non-controlling if all the other sensitivity inputs to the AND gate are $1^+$. In block 82, if the driving lead value is controlling, all other inputs are set to be non-controlling and insensitive. According to block 84 if the driving lead value is non-controlling, all other inputs are set to be non-controlling and sensitive. Then in block 86, the output of the gate is designated as the new driving lead. After block 86, the program proceeds to block 88 wherein the sensitivity of the new driving lead is determined in accordance with the forward sensitivity drives indicated in FIG. 7.

If the type of gate as determined in decision block 74 is an XOR gate, program flow is to block 90 wherein the output of the last XOR gate in the path (assuming more than one), or the single XOR gate if only one, is made the new driving lead. Then, in block 92, the value of such driving lead is set to $0^+$ for one partial solution and $1^+$ for another partial solution, thus providing two distinct solutions. After block 88 or block 92, return is made to decision block 72 for determination as to whether the driving lead is the reconvergent point. When the reconvergent point is reached, the program returns via notation P8 to the program of FIG. 31 where block 94 is entered. According to block 94, the sensitivity value implications on all branch paths are justified, i.e., by means of backward sensitivity and insensitivity drives (FIGS. 8 and 9), the sensitivity values on the various other nodes toward the input side of the reconvergent fanout loop are ascertained. In block 96, if an inconsistency is detected (such as the example described in connection with FIGS. 11 and 12), the fanout loop is declared redundant in block 98. If there is no inconsistency, the determination of the sensitivity of the stem is carried out in block 100, i.e., using stem analysis as indicated in Table 1, and all newly enumerated values are stored as a partial solution as set forth in block 102. After block 98 or block 102, return is made, via point P6, to the program of FIG. 30. Then, according to FIG. 30, after all the branches and adjacent leads are enumerated (in steps 58 and 62) return is made at P4 to the program of FIG. 29. Here, in decision block 104, the determination is made (i.e., from the result of block 98) as to whether the fanout loop is redundant. If it is, TMA is rerun in block 106 with all redundant counts set to zero as was illustrated in FIG. 19. Return is then made to point P3 and the procedure is rerun without selecting reconvergent fanout loop sensitivity input values which would result in a repeated determination of redundancy. Multiple path sensitization may also be selected in accordance with stem analysis (Table 1). If the determination of decision block 104 is that the fanout loop is not redundant, program flow passes to block 108 which suitably reruns TMA with all negative counts added by their offsets. The occasion for this step may arise because the original run of TMA, e.g. as was depicted in FIG. 10, is inaccurate and as a result of deduction from counts in block 48, one or more negative counts result. Then the counts are corrected to provide positive values.

After block 108, the program returns at point P2 to FIG. 28 and decision block 110 where it is queried whether any outer reconvergent fanout loop exists within which the present reconvergent fanout loop is nested. If such is the case, the simulation goes to the outer fanout loop in block 112 and the entire procedure is repeated for that outer fanout loop. If there is no such outer fanout loop, the program proceeds to block 114 for determining whether there is another unenumerated reconvergent fanout loop in the circuit under consideration which does not encompass the present fanout loop. If there is another reconvergent fanout loop which has not been enumerated, such loop is chosen in block 116 with return to block 40. If there are no other reconvergent fanout loops the program ends.

Essentially the same program is followed for global enumeration, of course without the necessity of starting with an innermost loop, etc. Rather, the whole circuit is considered between the initial inputs and the principal output, and partial solutions are derived which specify the input vectors as hereinbefore described. Also, the global enumeration process starts with the rerun TMA of FIG. 19, if this rerun was necessary pursuant to local enumeration. Block 72 will, of course, refer to the principal output of the cone rather than the reconvergent point. In backward drive or "backtrace", if an output lead is sensitive and if the gate is a reconvergent gate, a partial solution from local enumeration is selected. If the gate is not a reconvergent gate but the output lead is sensitive, backward sensitivity drive is performed and test counts are decremented. If the gate is a reconvergent gate and the output lead is not sensitive, a partial solution from local enumeration is selected. If the gate is not a reconvergent gate and also the output lead is not sensitive, backward insensitivity drive is performed. If the output is $0^-$ (for an AND gate), or $1^-$ (for an OR gate) do nothing. Test counts are decremented. If there is an ambiguity in backtrace, i.e., if more than one set of possible input sensitivity values, then a set is selected satisfying the test counts.

The algorithms for the complete process can be formalized as follows. Boldface type indicates subroutine calls and italicized type indicates circuit leads or internal variables. These algorithms together with the included comments are largely self-explanatory in view of the foregoing description.

```
The algorithms for the complete process can
be formalized as follows.  Boldface type indicates
subroutine calls and italicized type indicates
circuit leads or internal variables.  These
algorithms together with the included comments are
largely self-explanatory in view of the foregoing
description.
```

```
Program test_gen()
  {
    preprocessing();
    global enumeration();
    postprocessing();
  }

Procedure preprocessing()
  {
    partition network into cones;
    for each cone
        {
          for every input lead a
              {
                initialize the test count matrix;
                calculate its depth measured from the
                  primary output;
              }
          while test count matrices are not stablized
              {
                forward propagate();
                backward propagate();
              }
          if there are any reconvergent fanouts
             then fanout handling();
        }
  }

Procedure forward_propagate();
  {
    forward-propagate matrices from primary inputs
      to primary outputs;
  }

Procedure backward_propagate();
  {
    backward-propagate matrices from primary outputs
      to primary inputs;
  }

Procedure postprocessing();
  {
    merge subvectors produced by different cones;
  } procedure fanout_handling()
  {
```

```
for each group of related reconvergent fanout loops
{
   /*
    * recursively figure out the propagation
    * conditions of fanout loops, starting with the
    * innermost one.
    */
   from innermost loop to outermost loop do
   {
      local_enumeration();
      if test counts have changed or redundancy exists
         then re-invoke TMA to refine test count
         matrices;
   }
}

Procedure local_enumeration()
{
   from deepest branch to shallowest branch (measured
    from P.O.)
   {
      /*
       * verify the existence of sensitive 1 and 0 on the
       * branch
       */
      for e_val = 0+ and 1+
      {
         if e_val has not been enumerated on the branch
           then
           {
              verify the existence of e_val on the
              branch with forward and backward
              sensitivity/insensitivity drives; utilize
              partial solutions from inner loops if
              applicable;
              if no inconsistency
                then
                {
                   perform stem analysis to determine
                   stem logic and sensitivity values;
                   record the enumeration as a
                   partial solution;
                }
                else declare the branch fault and
                   equivalent faults undetectable;
         }
```

```
            }
         }
/*
 * if the stem can not be sensitized by sensitizing any
 * branches, there still could be a possibility of stem
 * sensitization through multiple path sensitization;
 */
if $0^+$ or $1^+$ has not been enumerated on the stem
   then
      {
         check the possibility of multiple-path sensitization;
         if multiple-path sensitization fails
            then declare the stem fault undetectable;
            else record the enumeration as a partial solution;
      }
/*
 * enumerate all adjacent leads along all reconvergent paths.
 */
from deepest adjacent lead to shallowest adjacent lead
   {
      for $e\_val = 0^+$ and $1^+$
         {
            if $e\_val$ has not been enumerated on the lead
              then
                 {
                    verify the existence of $e\_val$ on the
                       lead by forward and backward drive
                       logic and sensitivity values, utilize
                       partial solutions from inner loops if
                       applicable;
                    if no inconsistency
                       then record the enumeration as a
                          partial solution;
                       else declare the lead fault and
                          equivalent faults undetectable;
                 }
         }
   }
/*
 * if the propagation conditions (partial solutions)
 * established by local enumeration could not satisfy
 * all requirements from previous stage, duplicate
 * some of the existing partial solutions to meet
 * those unsatisfied requirements;
 */
``` if stem and any adjacent leads have number of
  enumerations less than the corresponding sensitive
  test counts,
    then copy the existing partial solution to satisfy
      remaining test requirements;
}

Procedure global_enumeration()
{
    initialize all leads as "unset";
    for each deepest primary input lead with non-zero
    sensitive test count
    {
        if the sensitive test count is for $0^+$
          then set the input lead to $0^+$;
          else set the input lead to $1^+$;
        mark that primary input lead as "set";
        decrement that test count by 1;
        *current_lead* = that primary input lead;
        while *current_lead* <> primary output lead;
        {
            if the next gate is a reconvergent fanout
              then get a suitable partial solution;
              else perform forward sensitivity drive;
            mark all leads involved as "set";
            decrement test counts of output and other
              inputs of current gate;
            *current_lead* = output lead of the gate;
        }
        for each gate with "set" output and "unset"
        inputs
        {
            backtrace().
            mark all leads involved as "set";
        }
    }
}

Procedure backtrace()
{
    if the output lead is sensitive
      then if the gate is a reconvergent gate
          pick a suitable partial solution;
      else
          {
              perform backward sensitivity drive;
              in case of ambiguity, check the test counts;

```
            decrement test counts on all inputs,
    }
else if the gate is a reconvergent gate,
        then pick a suitable partial solution;
    else
    {
        perform backward insensitivity drive;
         in case of ambiguity, check the test counts;
        if the output is 0⁻ (for AND gate)
                or 1⁻ (for OR gate) do nothing; or
            decrement test counts on inputs.
    }
}
```

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

What is claimed is:

1. A method for determining a group of test vectors for testing an integrated circuit network including a plurality of gates interconnected at nodes including input reveal a predetpermined categoriyu of faults in said network, and output terminals of said integrated circuit network to reveal a predetermined category of faults in said network, comprising the steps of:
   measuring the testability of said integrated circuit network according to a test counting procedure including propagation of sensitivity test counts forwardly from input terminals to a principal output terminal and rearwardly back to said input terminals through gates between said input and output terminals of said network to provides test count matrices for the nodes of said network including said input and output terminals,
   enumerating the test counts from said matrices by driving individual sensitivity values from test count matrices at said input terminals forwardly to a said output terminal and rearwardly back to said input terminals in a number of successive passes in order to accumulate the test counts described by said matrices at said nodes, and
   separately storing a set of sensitivity values to which said input terminals are driven for each such pass, each set comprising a test vector for said network.

2. The method according to claim 1 wherein enumerating the test counts includes first locally enumerating sensitivity values for reconvergent fanout loops, wherein said reconvergent fanout loops have fanout loop stems, to determine the sensitivity of the fanout loop stems, and then globally enumerating the sensitivity values for the remainder of said circuit network.

3. A method for determining a group of test vectors for testing an integrated circuit network including a plurality of gates interconnected at nodes including input and output terminals of said integrated circuit network, comprising the steps of:
   measuring the testability of the circuit network by a test counting procedure to provide test counts for a plurality of nodes in the network, and
   enumerating individual sensitivity values in a plurality of passes for satisfying said test count, each pass defining an input vector for testing said circuit network, each pass including driving a sensitivity value forwardly and rearwardly through said network according to the logical determination of sensitivities appearing on driven and adjacent leads.

4. The method according to claim 3 wherein said test counting procedure comprises propagating test values in said network in accordance with known constraints.

5. A method for determining a group of test vectors for an integrated circuit network including a plurality of gates interconnected at nodes including input and output terminals of said integrated circuit network to reveal a predetermined category of faults in said network, wherein testability information including test counts are known for said network, said method comprising:
   driving individual sensitivity values forwardly in said network from input terminals to an output terminal in accordance with logic determinations, and
   driving sensitivity and insensitivity values rearwardly in said network in accordance with logic determinations until said test counts are satisfied,
   sensitivity and insensitivity values on said input terminals as a result of said procedure comprising test vectors for said network.

* * * * *